(12) United States Patent
Hayes et al.

(10) Patent No.: US 8,691,372 B2
(45) Date of Patent: Apr. 8, 2014

(54) ARTICLES COMPRISING HIGH MELT FLOW IONOMERIC COMPOSITIONS

(75) Inventors: Richard Allen Hayes, Beaumont, TX (US); Sam Louis Samuels, Landenberg, PA (US); Matthew Scott Hall, Landenberg, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 431 days.

(21) Appl. No.: 12/012,843

(22) Filed: Feb. 6, 2008

(65) Prior Publication Data

US 2008/0199690 A1 Aug. 21, 2008

Related U.S. Application Data

(60) Provisional application No. 60/901,387, filed on Feb. 15, 2007.

(51) Int. Cl.
*B32B 27/00* (2006.01)
*C08F 18/00* (2006.01)

(52) U.S. Cl.
USPC ........... 428/216; 428/412; 428/421; 428/422; 428/441; 428/500; 136/251; 521/38

(58) Field of Classification Search
USPC ..................................... 428/339, 216; 521/38
See application file for complete search history.

(56) References Cited

U.S. PATENT DOCUMENTS

| | | | |
|---|---|---|---|
| 2,632,921 A | 3/1953 | Kreidl | |
| 2,648,097 A | 8/1953 | Kritchever | |
| 2,683,894 A | 7/1954 | Kritchever | |
| 2,704,382 A | 3/1955 | Kreidl | |
| 3,344,014 A | 9/1967 | Rees | |
| 3,404,134 A * | 10/1968 | Rees | 525/362 |
| 3,762,988 A * | 10/1973 | Clock et al. | 428/215 |
| 3,957,537 A | 5/1976 | Baskett et al. | |
| 4,035,549 A | 7/1977 | Kennar | |
| 4,663,228 A | 5/1987 | Bolton et al. | |
| 4,668,574 A | 5/1987 | Bolton et al. | |
| 4,732,814 A | 3/1988 | Hatada et al. | |
| 4,799,346 A | 1/1989 | Bolton et al. | |
| 4,865,711 A | 9/1989 | Kittler | |
| 5,028,674 A | 7/1991 | Hatch et al. | |
| 5,037,875 A | 8/1991 | deGaravilla | |
| 5,411,845 A | 5/1995 | Robinson | |
| 5,415,942 A | 5/1995 | Anderson | |
| 5,476,553 A | 12/1995 | Hanoka et al. | |
| 5,478,402 A | 12/1995 | Hanoka | |
| 5,690,994 A | 11/1997 | Robinson | |
| 5,698,329 A | 12/1997 | Robinson | |
| 5,733,382 A | 3/1998 | Hanoka | |
| 5,759,698 A | 6/1998 | Tanuma et al. | |
| 5,762,720 A | 6/1998 | Hanoka et al. | |
| 5,763,062 A | 6/1998 | Smith et al. | |
| 5,770,312 A | 6/1998 | Robinson | |
| 5,895,721 A | 4/1999 | Naoumenko et al. | |
| 5,986,203 A | 11/1999 | Hanoka et al. | |
| 6,114,046 A | 9/2000 | Hanoka | |
| 6,150,028 A | 11/2000 | Mazon | |
| 6,187,448 B1 | 2/2001 | Hanoka et al. | |
| 6,320,116 B1 | 11/2001 | Hanoka | |
| 6,414,236 B1 * | 7/2002 | Kataoka et al. | 136/251 |
| 6,432,522 B1 | 8/2002 | Friedman et al. | |
| 6,500,888 B2 | 12/2002 | Baumgartner et al. | |
| 6,514,425 B1 | 2/2003 | Sekiya et al. | |
| 6,518,365 B1 | 2/2003 | Powell et al. | |
| 6,586,271 B2 * | 7/2003 | Hanoka | 438/66 |
| 6,660,930 B1 | 12/2003 | Gonsiorawski | |
| 6,680,082 B2 | 1/2004 | Chou et al. | |
| 6,680,821 B2 | 1/2004 | Kang | |
| 6,693,237 B2 * | 2/2004 | Zenko et al. | 136/251 |

(Continued)

FOREIGN PATENT DOCUMENTS

JP 06-322334 A 11/1994
JP 08-316508 A 11/1996

(Continued)

OTHER PUBLICATIONS

Machine English Translation of JP_09_176601_A, Hideshi Kotsubo, Thermosetting Adhesive Composition, Jul. 8, 1997, JPO, whole document, pp. 1-9.*
DuPont™ SentryGlas® Plus Architectural Safety Glass brochure (2005).
DuPont™ SentryGlas® Plus Edge Stability Results—Seven Year Test (2005).
DuPont™ SentryGlas® Plus Interlayer, Technical Bulletin—Strength Characteristics (2005).
DuPont™ SentryGlas® Plus Interlayer, Technical Bulletin—Weathering (2005).
DuPont™ SentryGlas® Plus Interlayer, Technical bulletin—Sealant Compatibility (2005).

(Continued)

*Primary Examiner* — Aaron Austin
*Assistant Examiner* — Tahseen N Khan
(74) *Attorney, Agent, or Firm* — Maria M. Kourtakis; Kelly Law Registry

(57) ABSTRACT

A polymeric film or sheet comprising an ionomeric composition comprising ionomeric copolymer of an alpha olefin and about 1 to about 30 wt % of alpha,beta-ethylenically unsaturated carboxylic acid having 3 to 8 carbons, based on the total weight of the ionomeric copolymer, wherein the carboxylic acid is neutralized to a level of 1 to 100 mol %, with one or more metal ions, based on the total number of moles of carboxylate groups in the ionomeric copolymer, and wherein the ionomeric copolymer has a Melt Index of about 20 to about 300 g/10 min. The ionomeric composition preferably comprises an additive selected from the group consisting of silane coupling agent, organic peroxide, and combinations thereof. In addition, an article comprising an interlayer formed of the polymeric film or sheet and an additional layer selected from the group consisting of glass, other polymeric interlayer sheets, polymeric film layers, and metal films or sheets. Examples of articles include safety windows and solar cells.

18 Claims, No Drawings

(56) References Cited

U.S. PATENT DOCUMENTS

| | | | |
|---|---|---|---|
| 6,852,806 B2 * | 2/2005 | Sasagawa et al. | 525/332.9 |
| 7,537,836 B2 | 5/2009 | Smith et al. | |
| 2002/0155302 A1 | 10/2002 | Smith et al. | |
| 2003/0000568 A1 | 1/2003 | Gonsiorawski | |
| 2003/0098059 A1 * | 5/2003 | Hanoka | 136/251 |
| 2004/0097653 A1 * | 5/2004 | Kim et al. | 525/130 |
| 2004/0144415 A1 | 7/2004 | Arhart | |
| 2005/0089692 A1 | 4/2005 | Anderson | |
| 2005/0279401 A1 * | 12/2005 | Arhart et al. | 136/251 |
| 2006/0057392 A1 | 3/2006 | Smillie et al. | |
| 2006/0084763 A1 | 4/2006 | Arhart et al. | |
| 2006/0121219 A1 | 6/2006 | Shelby et al. | |
| 2006/0141212 A1 | 6/2006 | Smith et al. | |
| 2006/0165929 A1 | 7/2006 | Lenges et al. | |
| 2006/0182983 A1 | 8/2006 | Paul et al. | |
| 2006/0265929 A1 | 11/2006 | Haney | |
| 2007/0092706 A1 | 4/2007 | Pesek et al. | |
| 2007/0122633 A1 | 5/2007 | Pesek et al. | |
| 2007/0154694 A1 | 7/2007 | Samuels et al. | |
| 2007/0196630 A1 | 8/2007 | Hayes et al. | |
| 2007/0221268 A1 | 9/2007 | Hasch | |
| 2007/0228340 A1 | 10/2007 | Hayes et al. | |
| 2007/0267059 A1 | 11/2007 | Nishijima et al. | |
| 2007/0289693 A1 | 12/2007 | Anderson et al. | |
| 2008/0017241 A1 | 1/2008 | Anderson et al. | |
| 2008/0023063 A1 | 1/2008 | Hayes et al. | |
| 2008/0023064 A1 | 1/2008 | Hayes et al. | |
| 2008/0053516 A1 | 3/2008 | Hayes | |
| 2009/0023867 A1 | 1/2009 | Nishijima et al. | |
| 2009/0120489 A1 | 5/2009 | Nishijima et al. | |

FOREIGN PATENT DOCUMENTS

| | | | |
|---|---|---|---|
| JP | 09176601 A * | 7/1997 | |
| JP | 11-026791 A | 1/1999 | |
| JP | 2000-186114 A | 7/2000 | |
| JP | 2000186114 A | 7/2000 | |
| JP | 2001-089616 A | 4/2001 | |
| JP | 2001-119047 A | 4/2001 | |
| JP | 2001-119056 A | 4/2001 | |
| JP | 2001-119057 A | 4/2001 | |
| JP | 2001089616 A | 4/2001 | |
| JP | 2001119047 A | 4/2001 | |
| JP | 2001119056 A | 4/2001 | |
| JP | 2001119057 A | 4/2001 | |
| JP | 2001144313 A | 5/2001 | |
| JP | 2001261904 A | 9/2001 | |
| JP | 2004-031445 A | 1/2004 | |
| JP | 2004031445 A | 1/2004 | |
| JP | 2004058583 A | 2/2004 | |
| JP | 2005-034913 | 2/2005 | |
| JP | 2005-064266 | 3/2005 | |
| JP | 2005-064268 | 3/2005 | |
| JP | 2006-032308 A | 2/2006 | |
| JP | 2006-036874 A | 2/2006 | |
| JP | 2006-036875 A | 2/2006 | |
| JP | 2006-036876 A | 2/2006 | |
| JP | 2006032308 A | 2/2006 | |
| JP | 2006036875 A | 2/2006 | |
| JP | 2006-186237 A | 7/2006 | |
| JP | 2006-190865 A | 7/2006 | |
| JP | 2006-190867 A | 7/2006 | |
| JP | 2006190867 A | 7/2006 | |
| WO | WO 99/58334 A2 | 11/1999 | |
| WO | 02/28962 A2 | 4/2002 | |
| WO | 03/054260 A1 | 7/2003 | |
| WO | 03/064166 A1 | 8/2003 | |
| WO | 2006/002389 A1 | 1/2006 | |
| WO | 2006/057361 A1 | 6/2006 | |
| WO | WO 2006/057771 A2 | 6/2006 | |
| WO | WO 2006/070793 A1 | 7/2006 | |
| WO | 2006/085603 A1 | 8/2006 | |
| WO | WO 2006/085603 A1 | 8/2006 | |
| WO | 2006/095762 A1 | 9/2006 | |
| WO | WO 2006/095762 A1 | 9/2006 | |
| WO | WO 2006/095911 A1 | 9/2006 | |
| WO | WO 2007/009445 A1 | 8/2007 | |

OTHER PUBLICATIONS

DuPont™ SentryGlas® Plus Interlayer, Technical Bulletin—Ultra-Violet Radiation Control (2005).
DuPont™ SentryGlas® Plus Interlayer, Technical Bulletin—Solar Energy Control (2005).
DuPont™ SentryGlas® Plus Interlayer, Technical Bulletin—Visual Quality (2005).
DuPont™ SentryGlas® Plus Interlayer, Technical Bulletin—Post-Glass Breakage Performance (2005).
Lenges, DuPont Photovoltaic Solutions, Encapsulation Technologies (2006).
DuPont Encapsulation Options, Resin Versus Interlayer Options (2007).
DuPont Encapsulation Offerings, Resins (2007).
DuPont™ SentryGlas® Interlayers, Interlayer Options for Solar Cell Encapsulation—SentryGlas® (2007).
DuPont Encapsulation Offerings, DuPont SentryGlas® Plus Interlayers, Options for Solar Cell Encapsulation—SentryGlas® Plus (2007).
U.S. Appl. No. 12/012,891, filed Feb. 6, 2008, Inventors: Richard Allen Hayes and Sam Louis Samuels.
U.S. Appl. No. 11/796,858, filed Apr. 30, 2007, Inventor: Richard Allen Hayes.
U.S. Appl. No. 11/705,196, filed Feb. 12, 2007, Inventors: Richard Allen Hayes, Geraldine M. Lenges, Steven C. Pesek.
U.S. Appl. No. 11/704,013, filed Feb. 7, 2007, Inventor Richard Allen Hayes.
U.S. Appl. No. 11/633,256, filed Dec. 4, 2006, Inventor: Richard Allen Hayes.
U.S. Appl. No. 11/588,628, filed Oct. 27, 2006, Inventor Richard Allen Hayes.
U.S. Appl. No. 11/796,858, filed Apr. 30, 2007. Inventor: Richard Allen Hayes.
U.S. Appl. No. 11/796,755, filed Apr. 30, 2007, Inventor Richard Allen Hayes.
U.S. Appl. No. 11/985,705, filed Nov. 16, 2007, Inventors Cadwallader et al.
U.S. Appl. No. 11/181,511, filed Jul. 14, 2005, Inventors Hayes et al.
U.S. Appl. No. 11/865,391, filed Oct. 1, 2007, Inventors Hayes et al.
ASTM D 1238-04c.
PCT International Search Report for International Application No. PCT/US2008/002094, dated May 30, 2008.
PCT International Written Opinion for International Application No. PCT/US2008/002094, dated May 30, 2008.
DuPont™ SentryGlas® Plus Laminating Guide, Oct. 2006.

* cited by examiner

ARTICLES COMPRISING HIGH MELT FLOW IONOMERIC COMPOSITIONS

CROSS-REFERENCE TO RELATED APPLICATION

This application claims priority to U.S. Provisional Appln. No. 60/901,387, filed on Feb. 15, 2007, which is incorporated herein by reference in its entirety.

FIELD OF THE INVENTION

The invention relates to ionomeric compositions, polymeric films or sheets derived therefrom, and their utility in safety laminates and solar cell modules.

BACKGROUND OF THE INVENTION

Glass laminated products have contributed to society for almost a century. Beyond the well known, every day automotive safety glass used in windshields, laminated glass is used in all forms of the transportation industry. Safety glass is characterized by high impact and penetration resistance and does not scatter glass shards and debris when shattered.

Safety glass typically consists of a sandwich of two glass sheets or panels bonded together with an interlayer of a polymeric sheet. One or both of the glass sheets may be replaced with optically clear rigid polymeric sheets, such as sheets made of polycarbonates. Safety glass has further evolved to include multiple layers of glass and polymeric sheets bonded together with interlayers of polymeric sheets.

The interlayers used in safety glass are typically made from relatively thick polymer sheets, which exhibit toughness and bondability to the glass in the event of a crack or crash. Widely used interlayer materials include complex, multicomponent compositions based on poly(vinyl butyral) (PVB), poly(urethane) (PU), poly(ethylene vinyl acetate) (EVA), ionomers, and the like.

As a renewable energy resource, the use of solar cell modules is rapidly expanding. One preferred way of manufacturing a solar cell module involves forming a pre-laminate assembly comprising at least 5 structural layers. The solar cell pre-laminates are constructed in the following order starting from the top, or incident layer (that is, the layer first contacted by light) and continuing to the backing (the layer furthest removed from the incident layer): (1) incident layer (typically a glass plate or a thin polymeric film (such as a fluoropolymer or polyester film), but could conceivably be any material that is transparent to sunlight), (2) front encapsulant layer, (3) voltage-generating component (or solar cell component), (4) back encapsulant layer, and (5) backing layer.

The encapsulant layers are designed to encapsulate and protect the fragile voltage-generating component. Generally, a solar cell pre-laminate will incorporate at least two encapsulant layers sandwiched around the solar cell component. The optical properties of the front encapsulant layer must be such that light can be effectively transmitted to the solar cell component. Additionally, encapsulant layers generally have similar requirements and compositions to that described above for glazing interlayers.

The use of ionomeric compositions as threat resistant safety laminate interlayer sheets has been known within the art (see, e.g. U.S. Pat. No. 3,344,014; U.S. Pat. No. 3,762,988; U.S. Pat. No. 4,663,228; U.S. Pat. No. 4,668,574; U.S. Pat. No. 4,799,346; U.S. Pat. No. 5,759,698; U.S. Pat. No. 5,763,062; U.S. Pat. No. 5,895,721; U.S. Pat. No. 6,150,028; U.S. Pat. No. 6,432,522; US 2002/0155302; US 2002/0155302; WO 99/58334; and WO 2006/057771). For Example, U.S. Pat. No. 5,759,698 discloses a glass laminate interlayer derived from an ionomer resin which has been thermoset with an organic peroxide and a silane agent.

The use of ionomeric compositions as solar cell encapsulant films or sheets has also been known within the art (see, e.g., U.S. Pat. No. 5,476,553; U.S. Pat. No. 5,478,402; U.S. Pat. No. 5,733,382; U.S. Pat. No. 5,762,720; U.S. Pat. No. 5,986,203; U.S. Pat. No. 6,114,046; U.S. Pat. No. 6,187,448; U.S. Pat. No. 6,660,930; US 2003/0000568; US 2005/0279401; JP 2000186114; and JP 2006032308).

However, the ionomeric resins being used in the art of safety laminates or solar cell modules generally have a low melt flow index (MI) of 15 g/10 min or less (2160 g, 190° C., ISO 1133, ASTM D1238). The use of such low melt flow ionomeric resins requires higher lamination temperatures (i.e., 130° C.-170° C.) and therefore may complicate the lamination process.

Chou et al., in U.S. Pat. No. 6,680,821, describe a method of coating a metallic surface using a resin powder comprising certain metal neutralized acid copolymers comprising an alpha-olefin and an alpha-beta unsaturated carboxylic acid with a MI in the range of from about 20 to about 1,000 g/10 min. This patent does not describe use of such materials within safety glass or photovoltaic module laminates or additive packages that enhance the performance of the copolymers in such uses.

There is a need for polymeric film or sheet suitable for use as interlayers in glass laminate end-use applications, such as safety windows and solar cells, that do not have the shortcomings described above, as well as for compositions useful in forming such films or sheets. For instance, there is a desire to prepare useful compositions with a reduced extrusion compounding temperature. In addition, there is a desire to reduce the lamination temperature, preferably to about 100° C. to about 120° C., or to reduce the lamination cycle time, or both, and therefore simplifying the lamination process. In addition, there is a desire for films or sheets that have enhanced adhesion strength under a wide variety of lamination temperatures, including such desirable lower temperatures, and to provide the laminates with improved shock resistance.

SUMMARY OF THE INVENTION

The invention is directed to a polymeric film or sheet comprising an ionomeric composition comprising ionomeric copolymer of an alpha olefin and about 1 to about 30 wt % of alpha,beta-ethylenically unsaturated carboxylic acid having 3 to 8 carbons, based on the total weight of the ionomeric copolymer, wherein the carboxylic acid is neutralized to a level of 1 to 100 mol %, with one or more metal ions, based on the total number of moles of carboxylate groups in the ionomeric copolymer, and wherein the ionomeric copolymer has a Melt Index of about 20 to about 300 g/10 min.

Preferably the ionomeric copolymer has a Melt Index of about 30 to about 200 g/10 min.

Preferably the alpha olefin is ethylene.

Preferably the alpha,beta-ethylenically unsaturated carboxylic acid is selected from the group consisting of acrylic acid, methacrylic acid, itaconic acid, maleic acid, maleic anhydride, fumaric acid, monomethyl maleic acid, and mixtures thereof.

Preferably the ionomeric copolymer comprises about 10 to about 25 wt % (more preferably about 15 to about 23 wt %, and most preferably about 18 to about 23 wt %) of the alpha, beta-ethylenically unsaturated carboxylic acid.

Preferably the carboxylic acid is neutralized to a level of 2 to 40 (preferably to 20) mol %, with one or more metal ions, based on the total number of moles of carboxylate groups in the ionomeric copolymer.

The films or sheets of the invention preferably have a total thickness of about 0.1 mil (0.003 mm) to about 250 mils (6.35 mm). In one embodiment, the polymeric film or sheet preferably has a thickness of about 10 to about 250 mils (about 0.25 to about 6.35 mm). In another embodiment, the polymeric film or sheet preferably has a thickness of about 0.1 to about 10 mils (about 0.003 to about 0.25 mm). In a third embodiment, the thickness is preferably about 10 to about 20 mils (about 0.25 to about 0.51 mm).

Preferably the ionomeric composition further comprises an additive selected from the group consisting of silane coupling agent, organic peroxide, and combinations thereof.

In one preferred embodiment, the ionomeric composition contains about 0.01 to about 5 wt % (more preferably about 0.05 to about 1 wt %) of the silane coupling agent, based on the total weight of the ionomeric composition. Preferably the silane coupling agent is selected from the group consisting of gamma-chloropropylmethoxysilane, vinyltrimethoxysilane, vinyltriethoxysilane, vinyltris(beta-methoxyethoxy)silane-gamma-vinylbenzylpropyltrimethoxysilane, N-beta-(N-vinylbenzylaminoethyl)-gamma-aminopropyltrimethoxysilane, gamma-methacryloxypropyltrimethoxysilane, vinyltriacetoxysilane, gamma-glycidoxypropyltrimethoxysilane, gamma-glycidoxypropyltriethoxysilane, beta-(3,4-epoxycyclohexyl)ethyltrimethoxysilane, vinyltrichlorosilane, gamma-mercaptopropylmethoxysilane, gamma-aminopropyltriethoxysilane, N-beta-(aminoethyl)-gamma-aminopropyltrimethoxysilane, and mixtures thereof.

In another preferred embodiment, the ionomeric composition contains about 0.01 to about 10 wt % (preferably about 0.5 to about 3 wt %) of the organic peroxide, based on the total weight of the ionomeric composition. Preferably the organic peroxide is selected from the group consisting of 2,5-dimethylhexane-2,5-dihydroperoxide, 2,5-dimethyl-2,5-di(tert-betylperoxy)hexane-3, di-tert-butyl peroxide, tert-butyl-cumyl peroxide, 2,5-dimethyl-2,5-di(tert-butylperoxy)hexane, dicumyl peroxide, alpha, alpha'-bis(tert-butyl-peroxyisopropyl)benzene, n-butyl-4,4-bis(tert-butylperoxy)valerate, 2,2-bis(tert-butylperoxy)butane, 1,1-bis(tert-butyl-peroxy)cyclohexane, 1,1-bis(tert-butylperoxy)-3,3,5-trimethyl-cyclohexane, tert-butyl peroxybenzoate, benzoyl peroxide and mixtures thereof.

The invention is also directed to an article comprising an interlayer formed of the polymeric film or sheet and an additional layer selected from the group consisting of glass, other polymeric interlayer sheets, polymeric film layers, and metal films or sheets.

By "other polymeric interlayer sheets" reference is made to an interlayer sheet that may be the same as or different than interlayer formed of the polymeric film or sheet. Preferably the other polymeric interlayer sheets are formed of materials selected from the group consisting of acid copolymers and ionomers derived therefrom, poly(ethylene-co-vinyl acetate) (EVA), poly(vinyl acetal), polyurethane (PU), polyvinylchloride (PVC), polyethylenes, polyolefin block elastomers, ethylene acrylate ester copolymers, silicone elastomers and epoxy resins. In one preferred embodiment, the other polymeric interlayer sheet is the same or substantially similar to the interlayer formed of the polymeric film or sheet.

Preferably the polymeric film layers are formed of materials selected from the group consisting of polyesters, poly (ethylene naphthalate), polycarbonate, polyolefins, norbornene polymers, polystyrene, styrene-acrylate copolymers, acrylonitrile-styrene copolymers, polysulfones, nylons, poly(urethanes), acrylics, cellulose acetates, cellophane, vinyl chloride polymers, and fluoropolymers.

In a preferred embodiment, the article is a safety glass laminate wherein the additional layer is a glass sheet and the interlayer is laminated to the glass sheet. Preferably the interlayer is self-adhered to the glass sheets. Preferably the safety glass laminate comprises two sheets of glass and the interlayer is laminated between the glass sheets. Preferably the interlayer is self-adhered to the two glass sheets. Preferably the interlayer has a thickness of about 10 to about 250 mils (about 0.25 to about 6.35 mm).

In another preferred embodiment, the article is a solar cell pre-laminate assembly and comprises a solar cell component comprising one or a plurality of solar cells. The solar cell pre-laminate assembly preferably further comprises a second polymeric layer that is positioned next to the solar cell component on the opposite side from the polymeric film or sheet, wherein the second polymeric layer comprises a polymeric composition selected from the group consisting of poly(vinyl acetal), ethylene vinyl acetate, polyurethane, polyvinylchloride, polyethylenes, polyolefin block elastomers, ethylene acrylate ester copolymers, copolymer of alpha olefin and alpha,beta-ethylenically unsaturated carboxylic acid and ionomers thereof, silicone elastomers and epoxy resins. The solar cell pre-laminate assembly preferably contains an incident layer that is formed of a transparent material (preferably glass or a plastic film or sheet, most preferably glass) and serves as an outer layer at the light-receiving side of the assembly. The solar cell pre-laminate assembly preferably comprises a backing layer that serves as an outer layer at the back side of the assembly, wherein the backing layer preferably is formed of glass, plastic films or sheets, or metal films or sheets. Preferably, the interlayer has a thickness of about 0.1 to about 20 mils (about 0.003 to about 0.5 mm).

In one preferred embodiment, the solar cell pre-laminate assembly consists essentially of, from top to bottom, (i) an incident layer formed of a transparent material, which is positioned next to, (ii) a front encapsulant layer that is positioned next to, (iii) a solar cell component comprising one or a plurality of solar cells, which is positioned next to, (iv) an optional back encapsulant layer that is positioned next to, (v) a backing layer, wherein at least one of the encapsulant layers is formed of the polymeric film or sheet.

The invention is further directed to an article which is a solar cell prepared by the steps comprising (a) providing interlayer formed of the polymeric film or sheet, (b) providing a solar cell component comprising one or a plurality of solar cells; and (c) encapsulating the solar cell component in a matrix comprising the ionomeric composition.

The invention is also directed to a process of manufacturing an article, wherein the article is a solar cell module, the process comprising: (i) providing a solar cell pre-laminate assembly, and (ii) laminating the pre-laminate assembly to form the solar cell module. Preferably the step of lamination is conducted by subjecting the assembly to heat and, optionally, vacuum.

The invention is also directed to an improved polymeric composition comprising an ionomeric composition and an additive, wherein (i) the ionomeric composition comprises a copolymer of an alpha olefin and about 1 to about 30 wt % of an alpha,beta-ethylenically unsaturated carboxylic acid having 3 to 8 carbons, based on the total weight of the ionomeric copolymer, wherein the carboxylic acid is neutralized to a level of 1 to 100 mol %, with one or more metal ions, based on the total number of moles of carboxylate groups in the ionomeric copolymer, (ii) the ionomeric copolymer has a Melt Index of about 20 to about 300 g/10 min and (iii) the additive is selected from the group consisting of silane coupling agent, organic peroxide, and combinations thereof. The invention is also directed to shaped articles comprising this polymeric composition. Preferably the shaped article is a polymeric film or sheet. Preferably the film or sheet is a multilayer film or sheet comprising one surface layer formed of the polymeric composition. Preferably the multilayer film or sheet comprises two surface layers with both being formed of the polymeric composition. One preferred embodiment is a solar cell or solar cell pre-laminate.

DETAILED DESCRIPTION OF THE INVENTION

All publications, patent applications, patents, and other documents mentioned herein are incorporated by reference in their entirety. Unless otherwise defined, all technical and scientific terms used herein have the same meaning as commonly understood by one of ordinary skill in the art to which this invention belongs. In case of conflict, the present specification, including definitions, will control.

Although methods and materials similar or equivalent to those described herein can be used in the practice or testing of the invention, suitable methods and materials are described herein.

Unless stated otherwise, all percentages, parts, ratios, etc., are by weight.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

When the term "about" is used in describing a value or an end-point of a range, the disclosure should be understood to include the specific value or end-point referred to.

As used herein, the terms "comprises," "comprising," "includes," "including," "containing," "characterized by," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The transitional phrase "consisting of" excludes any element, step, or ingredient not specified in the claim, closing the claim to the inclusion of materials other than those recited except for impurities ordinarily associated therewith. When the phrase "consists of" appears in a clause of the body of a claim, rather than immediately following the preamble, it limits only the element set forth in that clause; other elements are not excluded from the claim as a whole.

The transitional phrase "consisting essentially of" limits the scope of a claim to the specified materials or steps and those that do not materially affect the basic and novel characteristic(s) of the claimed invention. "A 'consisting essentially of' claim occupies a middle ground between closed claims that are written in a 'consisting of' format and fully open claims that are drafted in a 'comprising' format."

Where applicants have defined an invention or a portion thereof with an open-ended term such as "comprising," it should be readily understood that (unless otherwise stated) the description should be interpreted to also describe such an invention using the terms "consisting essentially of" or "consisting of."

Use of "a" or "an" are employed to describe elements and components of the invention. This is done merely for convenience and to give a general sense of the invention. This description should be read to include one or at least one and the singular also includes the plural unless it is obvious that it is meant otherwise.

In describing certain polymers it should be understood that sometimes applicants are referring to the polymers by the monomers used to make them, the amounts of the monomers used to make them, or by the monomer residues incorporated within them. While such a description may not include the specific nomenclature used to describe the final polymer or may not contain product-by-process terminology, any such reference to monomers, monomer residues, repeat units, and amounts should be interpreted to mean that the polymer is made from those monomers or that amount of the monomers, and the corresponding polymers and compositions thereof. In this regard, a reference to a copolymer containing residues of a monomer is referring to the fact that the copolymer contains repeat units from that monomer. When applicants refer to a copolymer containing a percentage of a monomer, it should be understood that this reference is to the copolymer containing repeat units from that monomer.

In describing and/or claiming this invention, the term "copolymer" is used to refer to polymers containing two or more monomers.

The terms "finite amount" and "finite value" are used to refer to an amount that is greater than zero.

The term "acid copolymer" is used to refer to a resin composition comprised of copolymerized residues of an alpha olefin and copolymerized residues of an alpha, beta-ethylenically unsaturated carboxylic acid having 3 to 8 carbons. The term "ionomer" is used herein to refer to a resin composition derived from a partially or fully neutralized "acid copolymer".

High Melt Flow Ionomeric Compositions

The invention is related to certain high melt flow ionomeric compositions that are useful in forming safety interlayer sheets or solar cell encapsulant films or sheets. Specifically, the high melt flow ionomeric composition is comprised of an ionomer copolymer having a MI of about 20 to about 300 g/10 min, as measured by ASTM D1238 at 190° C. and a 2160 g load. (A similar ISO test is ISO 1133.)

Ionomeric Copolymers

The high melt flow ionomeric copolymer is derived from certain parent acid copolymer comprising a finite amount of an alpha olefin and about 1 to about 30 wt % of an alpha,beta-ethylenically unsaturated carboxylic acid having 3 to 8 carbons, based on the total weight of the copolymer. Preferably, the parent acid copolymer comprises about 10 to about 25 wt %, or more preferably, about 15 to about 23 wt %, or yet more preferably, about 18 to about 23 wt %, of the alpha,beta-ethylenically unsaturated carboxylic acid, based on the total weight of the copolymer.

The alpha olefin comonomers typically incorporate from 2 to 10 carbon atoms. Preferable alpha olefins include, but are not limited to, ethylene, propylene, 1-butene, 1-pentene, 1-hexene, 1-heptene, 3-methyl-1-butene, 4-methyl-1-pentene, and the like and mixtures thereof. More preferably, the alpha olefin is ethylene. The alpha,beta-ethylenically unsaturated carboxylic acid comonomers may include acrylic acid, methacrylic acid, itaconic acid, maleic acid, maleic anhydride, fumaric acid, monomethyl maleic acid, and mixtures thereof. Preferable alpha,beta-ethylenically unsaturated carboxylic acid comonomers include acrylic acid, methacrylic acid and mixtures thereof.

The parent acid copolymers may be polymerized as disclosed in U.S. Pat. No. 3,404,134; U.S. Pat. No. 5,028,674; U.S. Pat. No. 6,500,888; and U.S. Pat. No. 6,518,365.

To produce the high melt flow ionomeric copolymers, the parent acid copolymers are neutralized from about 1% to about 100%, or preferably, from about 1% to about 50%, or more preferably, from about 2% to about 40%, or yet more preferably, from about 2% to about 20%, with metallic ions, based on the total carboxylic acid content. The metallic ions may be monovalent, divalent, trivalent, multivalent, or mixtures therefrom. Useful monovalent metallic ions include, but are not limited to, sodium, potassium, lithium, silver, mercury, copper, and the like and mixtures thereof. Useful divalent metallic ions include, but are not limited to, beryllium, magnesium, calcium, strontium, barium, copper, cadmium, mercury, tin, lead, iron, cobalt, nickel, zinc, and the like and mixtures therefrom. Useful trivalent metallic ions include, but are not limited to, aluminum, scandium, iron, yttrium, and the like and mixtures therefrom. Useful multivalent metallic ions include, but are not limited to, titanium, zirconium, hafnium, vanadium, tantalum, tungsten, chromium, cerium, iron, and the like and mixtures therefrom. It is noted that when the metallic ion is multivalent, complexing agents, such as stearate, oleate, salicylate, and phenolate radicals are included, as disclosed within U.S. Pat. No. 3,404,134. The metallic ions are preferably monovalent or divalent metallic ions. More preferably, the metallic ions are selected from the group consisting of sodium, lithium, magnesium, zinc, and mixtures therefrom. Yet more preferably, the metallic ions are selected from the group consisting of sodium, zinc, and mixtures therefrom. The parent acid copolymers of the invention may be neutralized as disclosed in U.S. Pat. No. 3,404,134.

The high melt flow ionomeric copolymers have a MI of about 20 to about 300 g/10 min. Preferably, the ionomeric copolymers have a MI of about 30 to about 200 g/10 min. In general, to achieve the desirable high melt flow rates of the ionomeric copolymers, the parent acid copolymers should have a MI of about 50 to about 600 g/10 min, or preferably, about 50 to about 400 g/10 min, or more preferably, about 50 to about 200 g/10 min.

Such a high melt flow rate provides the ionomeric films or sheets derived therefrom with reduced lamination temperatures, or shorter cycle time, or both, when they are used in safety laminates or solar cell laminates. Moreover, when laminated under the lamination temperatures, films or sheets derived from such high melt flow ionomeric compositions possess higher adhesion strength than those derived from ionomeric compositions with relatively lower melt flow rates.

The high melt flow ionomeric copolymers may optionally contain other unsaturated comonomers. Specific examples of preferable other unsaturated comonomers include, but are not limited to, methyl acrylate, methyl methacrylate, ethyl acrylate, ethyl methacrylate, isopropyl acrylate, isopropyl methacrylate, butyl acrylate, butyl methacrylate and mixtures thereof. In general, the ionomeric copolymers may incorporate 0 to about 50 wt %, or preferably, 0 to about 30 wt %, or more preferably, 0 to about 20 wt %, of the other unsaturated comonomer(s), based on the total weight of the copolymer.

Additives:

The high melt flow ionomeric composition may further comprise one or more additives.

In one particular embodiment, the ionomeric composition further comprises one or more silane coupling agents to further enhance the adhesion strength of the films or sheets derived therefrom.

Exemplary silane coupling agents that are useful in the invention include, but are not limited to, gamma-chloropropylmethoxysilane, vinyltrimethoxysilane, vinyltriethoxysilane, vinyltris(beta-methoxyethoxy)silane,gamma-vinylbenzylpropyltrimethoxysilane, N-beta-(N-vinylbenzylaminoethyl)-gamma-aminopropyltrimethoxysilane, gamma-methacryloxypropyltrimethoxysilane, vinyltriacetoxysilane, gamma-glycidoxypropyltrimethoxysilane, gamma-glycidoxypropyltriethoxysilane, beta-(3,4-epoxycyclohexyl)ethyltrimethoxysilane, vinyltrichlorosilane, gamma-mercaptopropylmethoxysilane, gamma-aminopropyltriethoxysilane, N-beta-(aminoethyl)-gamma-aminopropyltrimethoxysilane, and the like and mixtures thereof. The silane coupling agents are preferably incorporated in the ionomeric compositions at a level of about 0.01 to about 5 wt %, or more preferably, about 0.05 to about 1 wt %, based on the total weight of the composition.

It is noted that the silane coupling agents can reduce the melt flow rate of the ionomeric compositions to which they are incorporated. Therefore, with a set level of silane, the high melt flow ionomeric compositions can maintain a certain level of viscosity than the prior art lower melt flow ionomeric compositions.

In another embodiment of the invention, the ionomeric compositions may further comprise additives which effectively reduce the melt flow of the resin, to the limit of thermosetting the films or sheets during lamination. The use of such additives will enhance the upper end-use temperature and reduce creep of the laminate interlayer sheets or solar cell encapsulant films or sheets derived therefrom. Typically, the end-use temperature may be enhanced up to about 20 to about 70° C. In addition, safety laminates and solar cell laminates produced from such materials will be fire resistant. Specifically, by thermosetting the ionomeric resins during lamination, the resins will have a reduced tendency to melt and flow out of the laminate, which in turn, may serve as additional fuel for a fire.

Typically, the effective melt flow reducing additives are organic peroxides, such as 2,5-dimethylhexane-2,5-dihydroperoxide, 2,5-dimethyl-2,5-di(tert-betylperoxy)hexane-3, di-tert-butyl peroxide, tert-butylcumyl peroxide, 2,5-dimethyl-2,5-di(tert-butylperoxy)hexane, dicumyl peroxide, alpha,alpha'-bis(tert-butyl-peroxyisopropyl)benzene, n-butyl-4,4-bis(tert-butylperoxy)valerate, 2,2-bis(tert-butylperoxy)butane, 1,1-bis(tert-butyl-peroxy)cyclohexane, 1,1-bis(tert-butylperoxy)-3,3,5-trimethyl-cyclohexane, tert-butyl peroxybenzoate, benzoyl peroxide, and the like and mixtures combinations thereof. Preferably the organic peroxides decompose at a temperature of about 100° C. or higher to generate radicals. More preferably, the organic peroxides have a decomposition temperature which affords a half life of 10 hours at about 70° C. or higher to provide improved stability for blending operations.

Moreover, the temperature gap between the ionomer composition compounding temperature and the organic peroxide decomposition temperature is critical to avoid premature crosslinking during the compounding and film and sheet formation processes. In an extrusion process (which is the preferred process for manufacturing the high melt flow ionomeric films or sheets), the high melt flow ionomeric compositions require desirable reduced extrusion temperatures when compared to the otherwise lower melt flow ionomeric compositions and therefore effectively preventing premature crosslinking during extrusion compounding, film or sheet formation.

The organic peroxides are added at a level of about 0.01 to about 10 wt %, or preferably, about 0.5 to about 3 wt %, based on the total weight of the composition.

If desired, initiators, such as dibutyltin dilaurate, may also be contained in the ionomeric composition at a level of about 0.01 to about 0.05 wt %, based on the total weight of the composition. In addition, if desired, inhibitors, such as hydroquinone, hydroquinone monomethyl ether, p-benzoquinone, and methylhydroquinone, may be added for the purpose of enhancing control to the reaction and stability. Typically, the inhibitors would be added at a level of less than about 5 wt %, based on the total weight of the composition.

In yet another embodiment, the high melt flow ionomeric composition may further comprise any other suitable additive(s) known within the art. Such additives may include, but are not limited to, plasticizers, processing aides, flow enhancing additives, lubricants, pigments, dyes, flame retardants, impact modifiers, nucleating agents, antiblocking agents (e.g., silica), thermal stabilizers, UV absorbers, UV stabilizers, dispersants, surfactants, chelating agents, coupling agents, adhesives, primers, reinforcement additives (e.g., glass fiber), fillers, and the like. Generally, when used in solar cell encapsulant films or sheets, the additives that may reduce the optical clarity of the compositions, such as reinforcement additives and fillers, are reserved for those films or sheets used as the back encapsulant layers.

Thermal stabilizers can be used and have been widely disclosed within the art. Any known thermal stabilizer may find utility within the invention. Preferable general classes of thermal stabilizers include, but are not limited to, phenolic antioxidants, alkylated monophenols, alkylthiomethylphenols, hydroquinones, alkylated hydroquinones, tocopherols, hydroxylated thiodiphenyl ethers, alkylidenebisphenols, O-, N- and S-benzyl compounds, hydroxybenzylated malonates, aromatic hydroxybenzyl compounds, triazine compounds, aminic antioxidants, aryl amines, diaryl amines, polyaryl amines, acylaminophenols, oxamides, metal deactivators, phosphites, phosphonites, benzylphosphonates, ascorbic acid (vitamin C), compounds that destroy peroxide, hydroxylamines, nitrones, thiosynergists, benzofuranones, indolinones, and the like and mixtures thereof. The high melt flow ionomeric compositions may contain any effective amount of thermal stabilizers. Use of a thermal stabilizer is optional and in some instances is not preferred. When used, the high melt flow ionomeric compositions contain at least about 0.05 wt %, and up to about 10 wt %, more preferably up to about 5 wt %, and most preferably up to about 1 wt %, of thermal stabilizers, based on the total weight of the composition.

UV absorbers can be used and have also been widely disclosed within the art. Any known UV absorber may find utility within the invention. Preferable general classes of UV absorbers include, but are not limited to, benzotriazoles, hydroxybenzophenones, hydroxyphenyl triazines, esters of substituted and unsubstituted benzoic acids, and the like and mixtures thereof. The high melt flow ionomeric compositions may contain any effective amount of UV absorbers. Use of an UV absorber is optional and in some instances is not preferred. When used, the high melt flow ionomeric compositions contain at least about 0.05 wt %, and up about 10 wt %, more preferably up to about 5 wt %, and most preferably up to about 1 wt %, of UV absorbers, based on the total weight of the composition.

Hindered amine light stabilizers (HALS) can be used and have also been widely disclosed within the art. Generally, hindered amine light stabilizers are disclosed to be secondary, tertiary, acetylated, N-hydrocarbyloxy substituted, hydroxy substituted N-hydrocarbyloxy substituted, or other substituted cyclic amines which further incorporate steric hindrance, generally derived from aliphatic substitution on the carbon atoms adjacent to the amine function. The high melt flow ionomeric compositions may contain any effective amount of hindered amine light stabilizers. Use of hindered amine light stabilizers is optional and in some instances is not preferred. When used, the high melt flow ionomeric compositions contain at least about 0.05 wt %, and up to about 10 wt %, more preferably up to about 5 wt %, and most preferably, up to about 1 wt %, of hindered amine light stabilizers, based on the total weight of the composition.

High Melt Flow Ionomeric Films or Sheets

The invention further provides shaped articles, such as, films or sheets comprising the high melt flow ionomeric compositions. These high melt flow ionomeric films and sheets may be produced by any suitable process. For example, the films and sheets may be formed through dipcoating, solution casting, compression molding, injection molding, melt extrusions, melt blowing, or any other procedures that are known to those of skill in the art. Preferably, the high melt flow ionomeric films and sheets are formed by melt extrusion, which is a particularly preferred process for formation of "endless" products.

As discussed above, the high melt flow ionomeric films or sheets are useful in forming the interlayer sheets in safety laminates or encapsulant films or sheets in solar cell laminates. Moreover, the high melt flow ionomeric films or sheets may take the form of single-layer or multilayer films or sheets. By single-layer, it is meant that the film or sheet has only one single layer and that the one single layer is made of the high melt flow ionomeric composition. By multilayer, it is meant that the high melt flow ionomeric film or sheet has two or more sub-layers and that at least one of the sub-layers is made of the high melt flow ionomeric composition. The other sub-layer(s) of the multilayer film or sheet may be made of any suitable polymeric compositions. Preferably, however, the other sub-layer(s) is made of polymeric compositions selected from the group consisting of acid copolymers and ionomers derived therefrom, poly(ethylene vinyl acetate), poly(vinyl acetal) (e.g., poly(vinyl butyral)), polyurethane, polyvinylchloride, polyethylenes (e.g., metallocene-catalyzed linear low density polyethylenes), polyolefin block elastomers, ethylene acrylate ester copolymers (e.g., poly(ethylene-co-methyl acrylate) and poly(ethylene-co-butyl acrylate)), silicone elastomers and epoxy resins. More preferably, the other sub-layers are formed of polymeric compositions selected from the group consisting of acid copolymers and ionomers derived therefrom, poly(ethylene vinyl acetate), metallocene-catalyzed linear low density polyethylenes, polyolefin block elastomers, and ethylene acrylate ester copolymers. Moreover, to provide adequate adhesion strength, at least one, or preferably, both, of the surface sub-layers of the multilayer film or sheet are formed of the high melt flow ionomeric compositions. In one preferred embodiment, multilayer films and sheets with high flow ionomeric copolymer surfaces and low flow core layers provide the desirable low lamination temperatures and high adhesion of the invention.

The films or sheets of the invention preferably have a total thickness of about 0.1 mil (0.003 mm) to about 250 mils (6.35 mm). When used as a safety laminate interlayer sheet, the high melt flow ionomeric sheet preferably has a total thickness of about 10 mils (0.25 mm) to about 250 mils (6.35 mm), or more preferably, about 15 mils (0.38 mm) to about 90 mils (2.28 mm), or yet more preferably, about 30 mils (0.76 mm) to about 60 mils (1.52 mm). Also in accordance to the invention, for use as a solar cell encapsulant the sheet or film preferably has a thickness of about 0.1 mil (0.003 mm) to about 20 mils (0.51 mm). That is, when used in a flexible solar cell laminate as a solar cell encapsulant film, the high melt flow ionomeric film preferably has a total thickness of about 0.1 mil (0.003 mm) to about 10 mils (0.25 mm), or more preferably, about 1 mil (0.03 mm) to about 5 mils (0.13 mm), while when used in a rigid solar cell laminate as a solar cell encapsulant sheet, the high melt flow ionomeric sheet preferably has a total thickness of about 10 mils (0.25 mm) to about 20 mils (0.51 mm). The thickness of the individual sub-layers that make up the total multilayer ionomeric film or sheet is not critical and may be independently varied depending on the particular application. Preferably, however, the surface layers of a multilayer film or sheet should have a thickness of about 1 mil (0.03 mm) to about 5 mils (0.13 mm).

The high melt flow ionomeric films or sheets may have smooth or rough surfaces on one or both sides. Preferably, the high melt flow films or sheets have rough surfaces to facilitate the de-airing of the laminates through the laminate process. Providing channels for the escape of air and removing air during lamination is a known method for obtaining laminates having acceptable appearance. Rough surfaces can be effected by mechanically embossing or by melt fracture during extrusion of the interlayer sheet or encapsulant film or sheet followed by quenching so that the roughness is retained during handling. The surface pattern can be applied to the high melt flow ionomeric film or sheet through common art processes. For example, the as extruded film or sheet may be passed over a specially prepared surface of a die roll positioned in close proximity to the exit of the die which imparts the desired surface characteristics to one side of the molten polymer. Thus, when the surface of such roll has minute peaks and valleys, film or sheet formed of polymer cast thereon will have a rough surface on the side which contacts the roll which generally conforms respectively to the valleys and peaks of the roll surface. Such die rolls are disclosed in, e.g., U.S. Pat. No. 4,035,549.

If desired, one or both surfaces of the high melt flow ionomeric film or sheet may be treated to enhance the adhesion to other laminate layers. This treatment may take any form known within the art, including adhesives, primers, such as silanes, flame treatments (see, e.g., U.S. Pat. No. 2,632,921; U.S. Pat. No. 2,648,097; U.S. Pat. No. 2,683,894; and U.S. Pat. No. 2,704,382), plasma treatments (see e.g., U.S. Pat. No. 4,732,814), electron beam treatments, oxidation treatments, corona discharge treatments, chemical treatments, chromic acid treatments, hot air treatments, ozone treatments, ultraviolet light treatments, sand blast treatments, solvent treatments, and the like and combinations thereof. For example, a thin layer of carbon may be deposited on one or both surfaces of the film or sheet through vacuum sputtering as disclosed in U.S. Pat. No. 4,865,711. U.S. Pat. No. 5,415,942, on the other hand, discloses a hydroxy-acrylic hydrosol primer coating that may serve as an adhesion-promoting primer for poly (ethylene terephthalate) films.

The adhesive layer preferably can take the form of a monolayer of an adhesive primer or of a coating. The adhesive/primer coating may be less than about 1 mil (0.03 mm), or preferably, less than about 0.5 mil (0.013 mm), or more preferably, less than about 0.1 mil (0.003 mm) thick. The adhesives may be any adhesive or primer known within the art. Preferably, the adhesives or primers are silane coupling agents or poly(vinyl amine) or poly(allyl amine). The poly (allyl amine)-based primers and their application to poly(ethylene terephthalate) polymeric films are disclosed within U.S. Pat. No. 5,411,845; U.S. Pat. No. 5,770,312; U.S. Pat. No. 5,690,994; and U.S. Pat. No. 5,698,329.

Safety Laminates

The invention further provides safety laminates comprising a polymeric interlayer sheet formed of the high melt flow ionomeric composition. Specifically, the safety laminate comprises at least one rigid sheet layer and at least one layer of the high melt flow ionomeric sheet as an interlayer sheet.

As discussed above, at the lamination temperatures used herein, the high melt flow ionomeric interlayer sheets typically possess higher adhesion strength than those sheets derived from otherwise low melt flow ionomers, and therefore providing the safety laminate structures with improved shock resistance.

The rigid sheets may be glass or rigid plastic sheets, such as, polycarbonate, acrylics, polyacrylate, cyclic polyolefins (e.g., ethylene norbornene polymers), metallocene-catalyzed polystyrene, polyamides, polyesters, fluoropolymers and the like and combinations thereof. Metal sheets (such as, aluminum, steel or galvanized steel) or ceramic plates may be substituted for the rigid polymeric sheet or glass.

The term "glass" is meant to include not only window glass, plate glass, silicate glass, sheet glass, low iron glass, tempered glass, tempered CeO-free glass, and float glass, but also to include colored glass, specialty glass (such as those include ingredients to control, e.g., solar heating), coated glass (such as those sputtered with metals (e.g., silver or indium tin oxide) for solar control purposes), E-glass, Toroglass, Solex® glass (Solutia). Such specialty glasses are disclosed in, e.g., U.S. Pat. No. 4,615,989; U.S. Pat. No. 5,173,212; U.S. Pat. No. 5,264,286; U.S. Pat. No. 6,150,028; U.S. Pat. No. 6,340,646; U.S. Pat. No. 6,461,736; and U.S. Pat. No. 6,468,934. It is understood, however, that the type of glass to be selected for a particular laminate depends on the intended use.

One preferred embodiment of the invention is a safety laminate comprising at least one layer of glass, and at least one layer of the high melt flow ionomeric sheet. Preferably, the high melt flow ionomeric sheet is self-adhered to the glass. As used herein, when the polymeric sheet is said to be "self-adhered" to the glass, it is meant that there is no intermediate layer such as a primer or thin adhesive layer between the glass and the polymeric layer, nor has the surface of the glass or polymeric layer been specially treated. A more preferred embodiment of the invention is a laminate comprising two layers of glass and at least one layer of the high melt flow ionomeric sheets bonded in between. Preferably, the high melt flow ionomeric sheet is self-adhered to one or both of the glass layers.

The safety laminate of the invention may further comprise other optional interlayer sheets and/or film layers. The other optional interlayer sheets may be formed of any suitable materials, such as, acid copolymers and ionomers derived therefrom, poly(ethylene vinyl acetate), poly(vinyl acetal) (e.g., poly(vinyl butyral)), polyurethane, polyvinylchloride, polyethylenes (e.g., metallocene-catalyzed linear low density polyethylenes), polyolefin block elastomers, ethylene acrylate ester copolymers (e.g., poly(ethylene-co-methyl acrylate) and poly(ethylene-co-butyl acrylate)), silicone elastomers and epoxy resins. In one preferred embodiment, the other interlayer is a second polymeric film or sheet comprising an ionomeric composition. The thickness of the other optional interlayer sheet(s) is not critical and may be independently varied depending on the particular application. The values provided above for the acid copolymer layer are preferred in many instances.

The film layers used in the safety laminates may be metal, such as aluminum foil, or polymeric. Preferable polymeric film materials include, but are not limited to, polyesters (e.g., poly(ethylene terephthalate) (PET)), poly(ethylene naphthalate), polycarbonate, polyolefins (e.g., polypropylene, polyethylene, and cyclic polyloefins), norbornene polymers, polystyrene (including syndiotactic polystyrene), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.), cellophane, vinyl chloride polymers (e.g., polyvinylidene chloride, vinylidene chloride copolymers, etc.), fluoropolymers (e.g., polyvinyl fluoride, polyvinylidene fluoride, polytetrafluoroethylene, ethylene-tetrafluoroethylene copolymers, etc.) and the like. More preferably, the polymeric film is a biaxially oriented poly(ethylene terephthalate) film.

The thickness of the polymeric film is not critical and may be varied depending on the particular application. In general, however, the thickness of the polymeric film may range from about 0.1 mils (0.003 mm) to about 10 mils (0.26 mm), or preferably, from about 1 mil (0.025 mm) to about 7 mils (0.18 mm).

In addition, the polymeric films are sufficiently stress-relieved and shrink-stable under the coating and lamination processes. Preferably, the polymeric films are heat stabilized to provide low shrinkage characteristics when subjected to elevated temperatures (i.e. less than 2% shrinkage in both directions after 30 min at 150° C.).

The films may also be coated if desired. For example, the films may be coated with organic infrared absorbers and sputtered metal layers, such as silver, coatings and the like. Metal coated polymeric films are disclosed in, e.g., U.S. Pat. No. 3,718,535; U.S. Pat. No. 3,816,201; U.S. Pat. No. 4,465,736; U.S. 4,450,201; U.S. Pat. No. 4,799,745; U.S. Pat. No. 4,846,949; U.S. Pat. No. 4,954,383; U.S. Pat. No. 4,973,511; U.S. Pat. No. 5,071,206; U.S. Pat. No. 5,306,547; U.S. Pat. No. 6,049,419; U.S. Pat. No. 6,104,530; U.S. Pat. No. 6,204,480; U.S. Pat. No. 6,255,031; and U.S. Pat. No. 6,565,982. For example, the coating may function as oxygen and moisture barrier coatings, such as the metal oxide coating disclosed within U.S. Pat. No. 6,521,825; U.S. Pat. No. 6,818,819; and EP 1 182 710.

If desired, one or both surfaces of laminate layers, such as the ionomeric interlayer sheet(s), the optional other interlayer sheet(s) or film layer(s), or the rigid sheet(s), may be treated to enhance their adhesion strength, as described above.

The safety laminate of the invention may take any form known within the art. Preferable specific glass laminate constructions include, for example, wherein "ION" means the preferable high melt flow ionomer comprising interlayer sheet, as described above, glass/ION;
glass/ION/film;
glass/ION/glass;
glass/ION/film/ION/glass;
glass/ION/film/ION/film;
and the like.

The safety laminates of the invention may be produced by any of the lamination process that are described below in detail, or by other processes.

Solar Cell Pre-Laminate Assemblies and Solar Cell Laminates

The invention further provides a solar cell pre-laminate assembly which comprises a solar cell component formed of one or a plurality solar cells and at least one layer of the high melt flow ionomeric film or sheet that is described above.

Solar cells are commonly available on an ever increasing variety as the technology evolves and is optimized. Within the invention, a "solar cell" is meant to include any article which can convert light into electrical energy. Typical art examples of the various forms of solar cells include, for example, single crystal silicon solar cells, polycrystal silicon solar cells, microcrystal silicon solar cells, amorphous silicon based solar cells, copper indium selenide solar cells, compound semiconductor solar cells, dye sensitized solar cells, and the like. The most common types of solar cells include multi-crystalline solar cells, thin film solar cells, compound semiconductor solar cells and amorphous silicon solar cells due to relatively low cost manufacturing ease for large scale solar cells.

Thin film solar cells are typically produced by depositing several thin film layers onto a substrate, such as glass or a flexible film, with the layers being patterned so as to form a plurality of individual cells which are electrically interconnected to produce a suitable voltage output. Depending on the sequence in which the multi-layer deposition is carried out, the substrate may serve as the rear surface or as a front window for the solar cell module. By way of example, thin film solar cells are disclosed in U.S. Pat. No. 5,512,107; U.S. Pat. No. 5,948,176; U.S. Pat. No. 5,994,163; U.S. Pat. No. 6,040,521; U.S. Pat. No. 6,137,048; and U.S. Pat. No. 6,258,620. Examples of thin film solar cell modules are those that comprise cadmium telluride or CIGS, (Cu(In—Ga)(SeS)2), thin film cells.

In one particular embodiment, the solar cell pre-laminate assembly comprises one layer of the high melt flow ionomeric film or sheet, which is positioned next to the solar cell component and serves as one of the encapsulant layers, or preferably, the high melt flow ionomeric film or sheet is positioned next to the solar cell component at the light-receiving side and serves as the front encapsulant layer.

In accordance with the invention, besides the at least one high melt flow ionomeric film or sheet, the solar cell pre-laminate assembly may optionally further comprise encapsulant layers formed of other polymeric materials, such as, acid copolymers and ionomers derived therefrom, poly(ethylene vinyl acetate), poly(vinyl acetal) (e.g., poly(vinyl butyral), including acoustic grades of poly(vinyl butyral)), polyurethane, poly vinyl chloride, polyethylenes (e.g., linear low density metallocene-catalyzed polyethylenes), polyolefin block elastomers, ethylene acrylate ester copolymers (e.g., poly(ethylene-co-methyl acrylate) and poly(ethylene-co-butyl acrylate)), silicone elastomers and epoxy resins.

In a further embodiment, the solar cell pre-laminate assembly comprises two layers of the high melt flow ionomeric film or sheet, wherein each of the two high melt flow ionomeric films or sheets are laminated to each of the two sides of the solar cell component and serve as the front and back encapsulant layers.

The thickness of the individual encapsulant layers other than the high melt flow ionomeric film(s) or sheet(s) is not critical and may be independently varied depending on the particular application. Preferably, the thickness of each of these encapsulant layers may independently range from about 1 mil (0.026 mm) to about 120 mils (3.00 mm), or more preferably, from about 1 mil to about 40 mils (1.02 mm), or most preferably, from about 1 mil to about 20 mils (0.51 mm). In addition, all the encapsulant layer(s) comprised in the solar cell pre-laminate assemblies, may have smooth or rough surfaces. Preferably, however, the encapsulant layer(s) have rough surfaces to facilitate the de-airing of the laminates through the lamination process.

In yet a further embodiment, the solar cell pre-laminate assembly may further comprise an incident layer and/or a backing layer serving as the outer layers of the assembly at the light-receiving side and the back side, respectively.

The outer layers of the solar cell pre-laminate assemblies, i.e., the incident layers and the backing layer, may be derived from any suitable sheets or films. Suitable sheets may be glass or plastic sheets, such as, polycarbonate, acrylics, polyacrylate, cyclic polyolefins (e.g., ethylene norbornene polymers), metallocene-catalyzed polystyrene, polyamides, polyesters, fluoropolymers and the like and combinations thereof. In addition, metal sheets, such as aluminum, steel, galvanized steel, or ceramic plates may be utilized in forming the backsheet.

Suitable film layers may be polymeric. Preferred polymers used to form the polymeric films, include but are not limited to, polyesters (e.g., poly(ethylene terephthalate)), poly(ethylene naphthalate), polycarbonate, polyolefins (e.g., polypropylene, polyethylene, and cyclic polyloefins), norbornene polymers, polystyrene (including syndiotactic polystyrene), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.), cellophane, vinyl chloride polymers (e.g., polyvinylidene chloride, vinylidene chloride copolymers, etc.), fluoropolymers (e.g., polyvinyl fluoride, polyvinylidene fluoride, polytetrafluoroethylene, ethylene-tetrafluoroethylene copolymers, etc.) and the like. Most preferably, the polymeric film is biaxially oriented polyester film (preferably poly(ethylene terephthalate) film) or a fluoropolymer film (e.g., Tedlar®, Tefzel®, and Teflon® films, from E.I. du Pont de Nemours and Company, Wilmington, Del.). Fluoropolymer-polyester-fluoropolymer ("TPT") films are also preferred for some applications. Metal films, such as aluminum foil may also be used herein as the back-sheet.

The solar cell pre-laminate assembly of the invention, may optionally further comprise other functional film or sheet layers (e.g., dielectric layers or barrier layers) embedded within the assembly. Such functional layers may be derived from any of the above mentioned polymeric films or those that are coated with additional functional coatings. For example, poly(ethylene terephthalate) films coated with a metal oxide coating, such as those disclosed within U.S. Pat. No. 6,521,825; U.S. Pat. No. 6,818,819; and EP 1 182 710, may function as oxygen and moisture barrier layers in the laminates.

If desired, a layer of non-woven glass fiber (scrim) may also be included in the solar cell laminates to facilitate de-airing during the lamination process or to serve as reinforcement for the encapsulant layer(s). The use of such scrim layers within solar cell laminates is disclosed within, e.g., U.S. Pat. No. 5,583,057; U.S. Pat. No. 6,075,202; U.S. Pat. No. 6,204,443; U.S. Pat. No. 6,320,115; U.S. Pat. No. 6,323, 416; and EP 0 769 818.

In addition, it is understood that all the film or sheet layers positioned to the light-receiving side of the solar cell layer are made of transparent material to allow efficient transmission of sunlight into the solar cell component. In some instances, a special film or sheet may be included to serve both the function of an encapsulant layer and an outer layer. It is also conceivable that any of the film or sheet layers included in the assembly may be in the form of a pre-formed single-layer or multi-layer film or sheet.

If desired, one or both surfaces of the laminate layers of the solar cell pre-laminate assemblies may be treated to enhance the adhesion strength, as described above.

The solar cell pre-laminate assemblies may take any form known within the art. Preferable specific solar cell pre-laminate constructions (top (light incident) side to back side) include, for example, wherein "ION" means the preferable high melt flow ionomeric encapsulant film or sheet of the invention, as described above, glass/ION/solar cell/ION/glass;
glass/ION/solar cell/ION/fluoropolymer film;
fluoropolymer film/ION/solar cell/ION/glass;
fluoropolymer film/ION/solar cell/ION/fluoropolymer film;
glass/ION/solar cell/ION/polyester film;
fluoropolymer film/ION/solar cell/ION/polyester film;
glass/ION/solar cell/ION/barrier coated film/ION/glass;
fluoropolymer film/ION/barrier coated film/ION/solar cell/ION/barrier coated film/ION/fluoropolymer film;
glass/ION/solar cell/ION/aluminum stock;
fluoropolymer film/ION/solar cell/ION/aluminum stock;
glass/ION/solar cell/ION/galvanized steel sheet;
glass/ION/solar cell/ION/polyester film/ION/aluminum stock;
fluoropolymer film/ION/solar cell/ION/polyester film/ION/aluminum stock;
glass/ION/solar cell/ION/polyester film/ION/galvanized steel sheet;
fluoropolymer film/ION/solar cell/ION/polyester film/ION/galvanized steel sheet;
glass/ION/solar cell/acoustic poly(vinyl butyral) encapsulant layer/glass;
glass/ION/solar cell/poly(vinyl butyral) encapsulant layer/fluoropolymer film;
fluoropolymer film/ION/solar cell/acid copolymer encapsulant layer/Tedlar® film;
glass/ION/solar cell/ethylene vinyl acetate encapsulant layer/polyester film;
fluoropolymer film/ION/solar cell/poly(ethylene-co-methyl acrylate) encapsulant layer/polyester film;

glass/poly(ethylene-co-butyl acrylate) encapsulant layer/
solar cell/ION/barrier coated film/poly(ethylene-co-bu-
tyl acrylate) encapsulant layer/glass;
and the like.

The preferred fluoropolymer film in each of the above examples is a Tedlar® fluoropolymer film or a fluoropolymer-polyester-fluoropolymer trilayer film. The preferred polyester film in each of the above examples is a poly(ethylene terephthalate) film. The term "glass" is intended to refer to sheets of any of the aforementioned types of glass or glass alternatives.

The invention further provides solar cell laminates produced from the solar cell pre-laminate assemblies disclosed above. Specifically the solar cell laminates are formed by subjecting the solar cell pre-laminate assemblies to further lamination process, as provided below in detail.

Moreover, as discussed above, under the lamination temperature used herein, the high melt flow ionomeric encapsulant films or sheets possess higher adhesion strength than those encapsulant films or sheets derived from otherwise low melt flow ionomers, and therefore providing the solar cell laminate structures at the reduced lamination conditions described herein, and therefore provide solar cell laminate structures with a simplified production process.

Lamination Process

The invention further provides a simplified process for producing the safety laminates or solar cell laminates. Specifically, as provided above, the incorporation of the high melt flow ionomeric interlayer sheets or high melt flow ionomeric solar cell encapsulant films or sheets requires reduced lamination temperatures, or cycle time, or both compared to those used in the process involving low melt flow ionomers.

The lamination process may be an autoclave or non-autoclave process.

In an exemplary process, a glass sheet, a front encapsulant layer, a solar cell component, a back encapsulant layer and a backing layer (e.g., Tedlar® film), and a cover-glass sheet are laid up and laminated together under heat and pressure and a vacuum (for example, in the range of about 27-28 inches (689-711 mm) Hg) to remove air. Preferably, the glass sheet has been washed and dried. A typical glass type is 90 mil thick annealed low iron glass. In an exemplary procedure, the pre-laminate assembly of the invention is placed into a bag capable of sustaining a vacuum ("a vacuum bag"), drawing the air out of the bag using a vacuum line or other means of pulling a vacuum on the bag, sealing the bag while maintaining the vacuum, placing the sealed bag in an autoclave at a temperature of about 100° C. to about 180° C., at a pressure of about 150 to about 250, preferably about 200 psig (about 15 bar), for about 10 to about 50 minutes. Preferably the bag is autoclaved at a temperature of about 100° C. to about 120° C. for about 20 to about 45 minutes. More preferably the bag is autoclaved at a temperature of about 110° C. to about 120° C. for about 20 to about 40 minutes. A vacuum ring may be substituted for the vacuum bag. One type of vacuum bags is disclosed within U.S. Pat. No. 3,311,517. The high melt flow ionomeric films and sheets of the invention provide the desirable advantage of lower lamination temperatures and/or faster lamination cycle times, depending on the laminator's choice.

Any air trapped within the pre-laminate assembly may be removed through a nip roll process. For example, the pre-laminate assembly may be heated in an oven at a temperature of about 80° C. to about 120° C., or preferably, at a temperature of between about 90° C. and about 100° C., for about 15 to about 60 (preferably about 30) minutes. Thereafter, the heated pre-laminate assembly is passed through a set of nip rolls so that the air in the void spaces between the solar cell outside layers, the solar cell component, and the encapsulant layers may be squeezed out, and the edge of the assembly sealed. This process may provide the final solar cell module or may provide what is referred to as a pre-press assembly, depending on the materials of construction and the exact conditions utilized.

The pre-press assembly may then be placed in an air autoclave where the temperature is raised to about 100° C. to about 160° C., or preferably between about 110° C. and about 120° C., and pressure to between about 100 psig and about 300 psig, or preferably, about 200 psig (14.3 bar). These conditions are maintained for about 15 minutes to about 1 hour, or preferably, about 20 to about 50 minutes, after which, the air is cooled while no more air is added to the autoclave. After about 10 to about 30 (preferably about 20) minutes of cooling, the excess air pressure is vented and the solar cell laminates are removed from the autoclave. This should not be considered limiting. Essentially any lamination process known within the art may be used herein.

A non-autoclave lamination process has been disclosed, e.g., within U.S. Pat. No. 3,234,062; U.S. Pat. No. 3,852,136; U.S. Pat. No. 4,341,576; U.S. Pat. No. 4,385,951; U.S. Pat. No. 4,398,979; U.S. Pat. No. 5,536,347; U.S. Pat. No. 5,853,516; U.S. Pat. No. 6,342,116; U.S. Pat. No. 5,415,909; US 2004-0182493; US 2003-0148114 A1; EP 1 235 683 B1; WO 91/01880; and WO 03/057478 A1. Generally, the non-autoclave process includes heating the pre-laminate assembly or the pre-press assembly and, optionally, the application of vacuum, pressure or both. For example, the pre-press may be successively passed through heating ovens and nip rolls. A commercial example of a photovoltaic lamination process includes the Icolam vacuum laminating systems of Meier Vakuumtechnik GmbH, Bocholt, Germany.

In producing solar cell laminates, if desired, the edges of the laminates may be sealed to reduce moisture and air intrusion and the potential degradation effect on the efficiency and lifetime of the solar cell(s) by any means disclosed within the art. Suitable edge seal materials include, but are not limited to, butyl rubber, polysulfide, silicone, polyurethane, polypropylene elastomers, polystyrene elastomers, block elastomers, styrene-ethylene-butylene-styrene (SEBS), and the like.

EXAMPLES

The following Examples and are intended to be illustrative of the invention, and are not intended in any way to limit the scope of the invention.

Methods

The following methods are used in the Examples presented hereafter.

Melt Index

Melt Index (MI) is measured by ASTM D1238 at 190° C. using a 2160 g load. A similar ISO test is ISO 1133.

I. Lamination Process 1:

The laminate layers described below are stacked (laid up) to form the pre-laminate assembly described within the examples. For the assembly containing a film layer as the incident or back-sheet layer, a cover glass sheet is placed over the film layer. The pre-laminate assembly is then placed within a Meier ICOLAM 10/08 laminator, (Meier Vakuumtechnik GmbH, Bocholt, Germany). The lamination cycle includes an evacuation step (vacuum of 3 in. Hg) of 5.5 minutes and a pressing stage (pressure of 2 bar) of 5.5 minutes at a temperature of 115° C. For Examples 11, 16, 20, 52, 57 and 60 only, an additional step at 145° C. for 5 minutes while maintaining the pressing conditions is incorporated to cure the composition. The laminate is then removed.

II. Lamination Process 2:

The laminate layers described below are stacked (laid up) to form the pre-laminate assemblies described within the examples. For the assembly containing a film layer as the incident or back-sheet layer, a cover glass sheet is placed over the film layer. The pre-laminate assembly is then placed within a vacuum bag, the vacuum bag is sealed and a vacuum is applied to remove the air from the vacuum bag. The bag is placed into an oven and heated to 90-100° C. for 30 minutes to remove any air contained between the assembly. The pre-press assembly is then subjected to autoclaving at 115° C. for 30 minutes in an air autoclave to a pressure of 200 psig (14.8 bar), as described above. The air is then cooled while no more air is added to the autoclave. After 20 minutes of cooling when the air temperature reaches less than about 50° C., the excess pressure is vented, and the laminate is removed from the autoclave.

Examples 1-20

The 12×12 in (305×305 mm) laminate structures described below in Table 1 are assembled and laminated by Lamination Process 1.

TABLE 1

| | Laminate Structures | | | | |
|---|---|---|---|---|---|
| Example | Layer 1 | Layer 2 | Layer 3 | Layer 4 | Layer 5 |
| 1, 21 | Glass 1 | ION 1 | ION 1 | Glass 1 | |
| 2, 22 | Glass 1 | ION 2 | Glass 1 | | |
| 3, 23 | Glass 1 | ION 2 | ION 2 | Glass 1 | |
| 4, 24 | Glass 2 | ION 3 | PET 1 | ION 3 | Glass 2 |
| 5, 25 | Glass 3 | ION 4 | EBA | ION 4 | Glass 1 |
| 6, 26 | Glass 1 | ION 5 | ION 5 | PET 2 | |
| 7, 27 | Glass 2 | ION 6 | PET 3 | EVA | Glass 2 |
| 8, 28 | Glass 1 | ION 7 | PET 1 | | |
| 9, 29 | Glass 1 | ION 8 | PET 4 | PVB A | Glass 1 |
| 10, 30 | Glass 2 | ION 9 | PET 5 | PVB | PET 1 |
| 11, 31 | Glass 1 | ION 10 | ION 11 | ION 10 | Glass 1 |
| 12, 32 | Glass 2 | ION 12 | ION 12 | PET 1 | |
| 13, 33 | Glass 1 | ION 13 | PET 6 | ION 13 | Glass 1 |
| 14, 34 | Glass 1 | ION 14 | ION 11 | ION 14 | Glass 1 |
| 15, 35 | Glass 3 | ION 15 | PET 1 | ION 15 | Glass 2 |
| 16, 36 | Glass 1 | ION 16 | ION 11 | ION 16 | Glass 1 |
| 17, 37 | Glass 1 | ION 17 | PET 2 | ION 17 | Glass 1 |
| 18, 38 | Glass 2 | ION 18 | PET 4 | ION 18 | Glass 2 |
| 19, 39 | Glass 3 | ION 19 | ION 19 | Glass 1 | |
| 20, 40 | Glass 1 | ION 20 | Glass 1 | | |

ION 1 is a 20 mil (0.51 mm) thick embossed sheet of Ionomer A, a poly(ethylene-co-methacrylic acid) containing 15 wt % of polymerized residues of methacrylic acid that is 20% neutralized with zinc ion and having a MI of 30 g/10 min.

ION 2 is a 60 mil (1.52 mm) thick embossed tri-layer sheet having (i) two (2) 2 mil (0.06 mm) thick surface layers formed of a blend of Ionomer B, a poly(ethylene-co-methacrylic acid) containing 18 wt % of polymerized residues of methacrylic acid that is 10% neutralized with sodium ion and having a MI of 50 g/10 min, and 0.15 wt % of TINUVIN 328 (Ciba Specialty Chemicals Company), based on the total weight of the blend, and (ii) a core layer formed of a poly(ethylene-co-methacrylic acid) containing 18 wt % of polymerized residues of methacrylic acid that is 35% neutralized with sodium ion and having a MI of 1 g/10 min.

ION 3 is a 15 mil (0.38 mm) thick embossed tri-layer sheet having (i) two (2) 1 mil (0.03 mm) thick surface layers of Ionomer C, a poly(ethylene-co-methacrylic acid) containing 19 wt % of polymerized residues of methacrylic acid that is 7.5% neutralized with zinc ion and having a MI of 100 g/10 min and (ii) a core layer of a poly(ethylene-co-isobutyl acrylate-co-methacrylic acid) containing 10 wt % of polymerized residues of isobutyl acrylate and 10 wt % of polymerized residues of methacrylic acid that is 70% neutralized with zinc ions and having a MI of 1 g/10 min.

ION 4 is a 1 mil (0.03 mm) thick film of Ionomer D, a poly(ethylene-co-methacrylic acid) containing 19 wt % of polymerized residues of methacrylic acid that is 5% neutralized with zinc ion and having a MI of 200 g/10 min.

ION 5 is a 20 mil (0.51 mm) thick embossed sheet of Ionomer E, a poly(ethylene-co-methacrylic acid) containing 22 wt % of polymerized residues of methacrylic acid that is 7.5% neutralized with zinc ion and having a MI of 75 g/10 min.

ION 6 is a 20 mil (0.51 mm) thick embossed sheet of Ionomer F, a composition comprising 99.5 wt % of Ionomer A and 0.5 wt % of N-beta-(aminoethyl)-gamma-aminopropyltrimethoxysilane, based on the total weight of the composition.

ION 7 is a 90 mil (2.25 mm) thick embossed tri-layer sheet having (i) two (2) 1 mil (0.03 mm) thick surface layers of Ionomer G, a composition comprising 99.25 wt % of Ionomer B and 0.25 wt % of N-beta-(aminoethyl)-gamma-aminopropyltrimethoxysilane, based on the total weight of the composition, and (ii) a core layer of a poly(ethylene-co-n-butyl acrylate) containing 35 wt % of polymerized residues of n-butyl acrylate and having a MI of 3 g/10 min.

ION 8 is a 20 mil (0.51 mm) thick embossed tri-layer sheet having (i) two (2) 2 mil (0.06 mm) thick surface layers of Ionomer H, a composition comprising 99.875 wt % of Ionomer C and 0.125 wt % of N-beta-(aminoethyl)-gamma-aminopropyltrimethoxysilane, based on the total weight of the composition, and (ii) a core layer of a poly(ethylene-co-methacrylic acid) containing 22 wt % of polymerized residues of methacrylic acid that is 35% neutralized with sodium ion and having a MI of 1.5 g/10 min.

ION 9 is a 15 mil (0.38 mm) thick embossed sheet of Ionomer I, a composition comprising 99.875 wt % of Ionomer D and 0.125 wt % of gamma-glycidoxypropyltriethoxysilane, based on the total weight of the composition.

ION 10 is a 1 mil (0.03 mm) thick film of Ionomer J, a composition comprising 99.875 wt % of Ionomer E, 0.30 wt % of TINUVIN 1577, 0.30 wt % of CHIMASSORB 944, (products of the Ciba Specialty Chemicals Company), and 0.125 wt % of gamma-methacryloxypropyltrimethoxysilane, based on the total weight of the composition.

ION 11 is a 90 mil (2.25 mm) thick embossed sheet of Ionomer K, a composition comprising 98.5 wt % of Ionomer A and 1.5 wt % of 1,1-bis(t-butylperoxy)-3,3,5-trimethylcyclohexane, based on the total weight of the composition.

ION 12 is a 15 mil (0.38 mm) thick embossed sheet of Ionomer L, a composition comprising 98.0 wt % of Ionomer B and 2.0 wt % of 1,1-bis(t-butylperoxy)-3,3,5-trimethylcyclohexane, based on the total weight of the composition.

ION 13 is a 20 mil (0.51 mm) thick embossed sheet of Ionomer M, a composition comprising 97.5 wt % of Ionomer C, 0.5 wt % of CYASORB UV-1164 (Cytec Industries), and 2.5 wt % of 1,1-bis(t-butylperoxy)-3,3,5-trimethylcyclohexane, based on the total weight of the composition.

ION 14 is a 1 mil (0.03 mm) thick film of Ionomer N, a composition comprising 93.0 wt % of Ionomer D, 5.0 wt % of triallyl isocyanurate and 2.0 wt % of 1,1-bis(t-butylperoxy)-3,3,5-trimethylcyclohexane, based on the total weight of the composition.

ION 15 is a 20 mil (0.51 mm) thick embossed tri-layer sheet having (i) two (2) 1 mil (0.03 mm) thick surface layers of Ionomer O, a composition comprising 95.0 wt % of Ionomer E, 3 wt % of trimethylolpropane triacrylate and 2.0 wt % of 1,1- bis(t-butylperoxy)-3,3,5-trimethylcyclohexane, based on the total weight of the composition and (ii) a core layer of poly(ethylene-co-methyl acrylate) containing 25 wt % of polymerized residues of methyl acrylate and having a MI of 5 g/10 min.

ION 16 is a 1 mil (0.03 mm) thick film of Ionomer P, a composition comprising 98.0 wt % of Ionomer A, 0.5 wt % of vinyltrimethoxysilane, and 1.5 wt % of 1,1-bis(t-butylperoxy)-3,3,5-trimethylcyclohexane, based on the total weight of the composition.

ION 17 is a 20 mil (0.51 mm) thick embossed sheet of Ionomer Q, a composition comprising 97.75 wt % of Ionomer B, 0.25 wt % of gamma-methacryloxypropyltrimethoxysilane, and 2.0 wt % of 1,1-bis(t-butylperoxy)-3,3,5-trimethylcyclohexane, based on the total weight of the composition.

ION 18 is a 15 mil (0.38 mm) thick embossed tri-layer sheet having (i) two (2) 1 mil (0.03 mm) thick surface layers of Ionomer R, a composition comprising 97.375 wt % of Ionomer C, 0.125 wt % of N-beta-(N-vinylbenzylaminoethyl)-gamma-aminopropyltrimethoxysilane, and 2.5 wt % of 1,1-bis(t- butylperoxy)-3,3,5-trimethylcyclohexane, based on the total weight of the composition and (ii) a core layer of a poly(ethylene-co-methacrylic-acid) containing 18 wt % of polymerized residues of methacrylic acid that is 70% neutralized with sodium ion and having a MI of 1.5 g/10 min.

ION 19 is a 20 mil (0.51 mm) thick embossed tri-layer sheet having (i) two (2) 2 mil (0.06 mm) thick surface layers of Ionomer S, a composition comprising 92.875 wt % of Ionomer D, 5.0 wt % of triallyl isocyanurate, 0.125 wt % of gamma-methacryloxypropyltrimethoxysilane, and 2.0 wt % of 1,1-bis(t-butylperoxy)-3,3,5-trimethylcyclohexane, based on the total weight of the composition and (ii) a core layer of a poly(ethylene-co-methacrylic acid) containing 22 wt % of polymerized residues of methacrylic acid that is 35% neutralized with zinc ion and having a MI of 0.5 g/10 min.

ION 20 is a 90 mil (2.25 mm) thick embossed sheet of Ionomer T, a composition comprising 94.875 wt % of Ionomer E, 3 wt % of trimethylolpropane triacrylate, 0.125 wt % of N-beta-(N-vinylbenzylaminoethyl)-gamma-aminopropyltrimethoxysilane, CYASORB UV-1164, TINUVIN 123, and 2.0 wt % of 1,1-bis(t-butylperoxy)-3,3,5- trimethylcyclohexane, based on the total weight of the composition.

PVB A is a 40 mil (1.02 mm) thick acoustic poly(vinyl butyral) sheet containing 100 parts per hundred (pph) poly(vinyl butyral) with a hydroxyl number of 15 and plasticized with 48.5 pph plasticizer tetraethylene glycol diheptanoate, prepared in a way similar to those disclosed in PCT Patent Application No. WO 2004/039581.

Examples 21-40

The 12×12 in (305×305 mm) solar cell laminate structures described above in Table 1 are assembled and laminated by Lamination Process 2, above.

Examples 41-60

The 12×12 in (305×305 mm) solar cell pre-laminate structures described below in Table 2 are assembled and laminated by Lamination Process 1, above. Layers 1 and 2 constitute the incident layer and the front-sheet encapsulant layer, respectively, and Layers 4 and 5 constitute the back-sheet encapsulant layer and the backing layer, respectively.

TABLE 2

Solar Cell Pre-Lamination Structures

| Example | Layer 1 | Layer 2 | Layer 3 | Layer 4 | Layer 5 |
|---|---|---|---|---|---|
| 41, 61 | Glass 4 | ION 1 | Solar Cell 1 | ION 1 | FPF |
| 42, 62 | Glass 4 | EVA | Solar Cell 2 | ION 2 | Glass 1 |
| 43, 63 | Glass 4 | ION 3 | Solar Cell 3 | ION 2 | AL |
| 44, 64 | Glass 2 | ION 3 | Solar Cell 4 | ION 3 | Glass 2 |
| 45, 65 | FPF | ION 4 | Solar Cell 1 | ION 4 | FPF |
| 46, 66 | Glass 1 | ION 5 | Solar Cell 2 | ION 5 | PET 1 |
| 47, 67 | Glass 4 | ION 6 | Solar Cell 3 | ION 6 | FPF |
| 48, 68 | Glass 4 | ION 6 | Solar Cell 4 | ION 7 | PET 1 |
| 49, 69 | Glass 4 | ION 8 | Solar Cell 1 | ION 8 | Glass 1 |
| 50, 70 | Glass 4 | ION 9 | Solar Cell 2 | ION 9 | FPF |
| 51, 71 | FPF | ION 10 | Solar Cell 3 | ION 10 | FPF |
| 52, 72 | Glass 2 | ION 12 | Solar Cell 4 | ION 11 | Glass 2 |
| 53, 73 | Glass 4 | ION 13 | Solar Cell 1 | ION 13 | FPF |
| 54, 74 | FPF | ION 14 | Solar Cell 2 | ION 14 | PET 1 |
| 55, 75 | Glass 4 | ION 15 | Solar Cell 3 | ION 15 | AL |
| 56, 76 | FPF | ION 16 | Solar Cell 4 | ION 16 | FPF |
| 57, 77 | Glass 4 | ION 17 | Solar Cell 1 | ION 17 | Glass 1 |
| 58, 78 | Glass 4 | ION 18 | Solar Cell 2 | ION 18 | FPF |
| 59, 79 | FPF | ION 19 | Solar Cell 3 | ION 19 | AL |
| 60, 80 | Glass 4 | ION 19 | Solar Cell 4 | ION 20 | |

Examples 61-80

The 12×12 in (305×305 mm) solar cell pre-laminate structures described above in Table 2 are assembled and laminated by Lamination Process 2, above. Layers 1 and 2 constitute the incident layer and the front-sheet encapsulant layer, respectively, and Layers 4 and 5 constitute the back-sheet encapsulant layer and the backing layer, respectively.

Comparative Example CE1 Example 81

In Comparative Example CE1, 50 grams of a low melt flow ionomer, which was a poly(ethylene-co-methacrylic acid) copolymer containing 15 wt % polymerized residues of methacrylic acid that is 23% neutralized with zinc ions and having a MI of 5 g/10 min, was added to a 90° C. preheated Brabender Rheometer (C. W. Brabender Instruments, Inc., So. Hackensack, N.J.) equipped with a 50 cc mixing head over 1 minute, while the speed of the mixing blades was set at 8 rpm. The speed of the mixing blades was then increased to 30 rpm and the polymer resin was further mixed for 1 minute, after which the shear pin sheared due to high torque and the mixing motor was at 5 amps. The process was then shut down.

In Example 81, 50 grams of a high melt flow ionomer, which was a poly(ethylene-co-methacrylic acid) copolymer containing 15 wt % polymerized residues of methacrylic acid that is 11.9% neutralized with zinc ions and having a MI of 100 g/10 min, was added to a 90° C. preheated Brabender Rheometer equipped with a 50 cc mixing head over 1 minute, while the speed of the mixing blades was set at 8 rpm. The speed of the mixing blades was then increased to 30 rpm and the polymer resin was further mixed for 5 minutes, after which a homogeneous polymer melt was achieved with the mixing motor at 1 amp and the polymer melt temperature at 101° C. The process was shut down.

These results demonstrated that high melt flow ionomers (Example 81) can be compounded at temperatures low enough (about 90° C.) for the incorporation of organic peroxides through commercially-viable and scalable extrusion compounding equipment while the corresponding low melt flow ionomers (Comparative Example CE1) can not.

What is claimed is:

1. A safety glass laminate prepared by a process comprising the steps of:
   providing a polymeric film or sheet; wherein the polymeric film or sheet consists essentially of an ionomeric composition;
   wherein said polymeric film or sheet is formed from a melt of the ionomeric composition, and said melt is processed a temperature sufficiently low to prevent premature cross-linking in the ionomeric composition; and
   wherein said ionomeric composition consists essentially of:
      an ionomeric copolymer consisting essentially of copolymerized repeat units of ethylene; about 10 to about 30 wt %, based on the total weight of the ionomeric copolymer, of copolymerized repeat units of at least one alpha,beta-ethylenically unsaturated carboxylic acid selected from the group consisting of acrylic acid, methacrylic acid, itaconic acid, maleic acid, maleic anhydride, fumaric acid, and monomethyl maleic acid; and
      0 to about 50 wt %, based on the total weight of the ionomeric copolymer, of copolymerized repeat units of one or more other unsaturated comonomers selected from the group consisting of methyl acrylate, methyl methacrylate, ethyl acrylate, ethyl methacrylate, isopropyl acrylate, isopropyl methacrylate, butyl acrylate and butyl methacrylate; wherein the ionomeric copolymer is neutralized to a level of 1 to 100 mol %, based on the total number of moles of carboxylate groups in the ionomeric copolymer, and said ionomeric copolymer further comprises one or more metal ions; and further wherein the ionomeric copolymer has a Melt Index of about 20 to about 300 g/10 min, as measured by ASTM D1238 at 190° C. and under a load of 2160 g;
      about 0.5 to about 3 wt % of at least one organic peroxide, based on the total weight of the ionomeric composition; optionally about 0.01 to about 5 wt % of one or more silane coupling agents, based on the total weight of the ionomeric composition; and
      optionally
      one or more additives selected from the group consisting of initiators, inhibitors, plasticizers, processing aides, flow enhancing additives, lubricants, pigments, dyes, flame retardants, impact modifiers, nucleating agents, antiblocking agents, thermal stabilizers, UV absorbers, UV stabilizers, hindered amine light stabilizers, dispersants, surfactants, chelating agents, coupling agents, adhesives, primers, reinforcement additives and fillers;

laying up the polymeric film or sheet with at least one rigid sheet layer and optionally at least one additional layer to form a pre-laminate assembly;

subjecting the pre-laminate assembly to heat and optionally vacuum or pressure to form the safety glass laminate; and heating the safety glass laminate at a temperature sufficient to cause the peroxide to cross-link and cure the ionomeric composition.

2. The safety glass laminate of claim 1, wherein the at least one alpha,beta-ethylenically unsaturated carboxylic acid is selected from the group consisting of acrylic acid and methacrylic acid; the ionomeric copolymer comprises about 10 to about 25 wt % of the alpha,beta-ethylenically unsaturated carboxylic acid; and the ionomeric copolymer is neutralized to a level of 2 to 40 mol %.

3. The safety glass laminate of claim 1, wherein the ionomeric composition consists essentially of the ionomeric copolymer; and about 1.5 to about 3 wt % of the organic peroxide; wherein the ionomeric copolymer consists essentially of the copolymerized repeat units of ethylene and about 15 to about 23 wt % of copolymerized repeat units of acrylic acid, methacrylic acid, or acrylic acid and methacrylic acid; and wherein the ionomeric copolymer has a Melt Index of about 30 to about 200 g/10 min.

4. The safety glass laminate of claim 1, wherein the at least one alpha,beta-ethylenically unsaturated carboxylic acid is selected from the group consisting of acrylic acid and methacrylic acid; the ionomeric copolymer comprises about 15 to about 23 wt % of the copolymerized repeat units of the at least one alpha,beta-ethylenically unsaturated carboxylic acid; and the ionomeric copolymer is neutralized to a level of 2 to 40 mol %.

5. The safety glass laminate of claim 1, wherein the ionomeric composition comprises the one or more silane coupling agents, said silane coupling agent(s) selected from the group consisting of gamma-chloropropylmethoxysilane, vinyltrimethoxysilane, vinyltriethoxysilane, vinyltris(beta-methoxyethoxy)silane,gamma-vinylbenzylpropyltrimethoxysilane, N-beta-(N-vinylbenzylaminoethyl)-gamma-aminopropyltrimethoxysilane, gamma-methacryloxypropyltrimethoxysilane, vinyltriacetoxysilane, gamma-glycidoxypropyltrimethoxysilane, gamma-glycidoxypropyltriethoxysilane, beta-(3,4-epoxycyclohexyl)ethyltrimethoxysilane, vinyltrichlorosilane, gamma-mercaptopropylmethoxysilane, gamma-aminopropyltriethoxysilane, and N-beta-(aminoethyl)-gamma-aminopropyltrimethoxysilane.

6. The safety glass laminate of claim 1, wherein the at least one organic peroxide is selected from the group consisting of 2,5-dimethylhexane-2,5-dihydroperoxide, 2,5-dimethyl-2,5-di(tert-betylperoxy)hexane-3, di-tert-butyl peroxide, tert-butylcumyl peroxide, 2,5-dimethyl-2,5-di(tert-butylperoxy) hexane, dicumyl peroxide, alpha, alpha'-bis(tert-butylperoxyisopropyl)benzene, n-butyl-4,4-bis(tert-butylperoxy) valerate, 2,2-bis(tert-butylperoxy)butane, 1,1-bis(tert-butylperoxy)cyclohexane, 1,1-bis(tert-butyl peroxy)-3,3,5-trimethyl-cyclohexane, tert-butyl peroxybenzoate, and benzoyl peroxide.

7. The safety glass laminate of claim 1, wherein; the alpha, beta-ethylenically unsaturated carboxylic acid is selected from the group consisting of acrylic acid and methacrylic acid; the ionomeric copolymer comprises about 18 to about 23 wt % of the copolymerized repeat units of the at least one alpha,beta-ethylenically unsaturated carboxylic acid; the ionomeric copolymer is neutralized to a level of 2 to 20 mol %; and the at least one organic peroxide is selected from the group consisting of 2,5-dimethylhexane-2,5-dihydroperoxide, 2,5-dimethyl-2,5-di(tert-betylperoxy)hexane-3, di-tert-butyl peroxide, tert-butylcumyl peroxide, 2,5-dimethyl-2,5-di(tert-butylperoxy)hexane, dicumyl peroxide, alpha, alpha'-bis(tert-butyl-peroxyisopropyl)benzene, n-butyl-4,4-bis(tert-butylperoxy)valerate, 2,2-bis(tert-butylperoxy)butane, 1,1-bis(tert-butyl-peroxy)cyclohexane, 1,1-bis(tert-butylperoxy)-3,3,5-trimethyl-cyclohexane, tert-butyl peroxybenzoate, and benzoyl.

8. The safety glass laminate of claim 1, wherein the ionomeric copolymer has a Melt Index of about 75 to about 200 g/10 min.

9. The safety glass laminate of claim 1, wherein the one or more additives are selected from the group consisting of:
about 0.01 to about 0.05 wt % of the initiator dibutyltin dilaurate;
up to about 5 wt % of one or more inhibitors, said inhibitor(s) selected from the group consisting of hydroquinone, hydroquinone monomethyl ether, p-benzoquinone, and methylhydroquinone;
about 0.05 wt % up to about 5 wt % of the thermal stabilizer;
about 0.05 wt % to about 5 wt % of the UV absorber; and
about 0.05 wt % to about 5 wt % of the hindered amine light stabilizer;
wherein the weight percentages are based on the total weight of the ionomeric composition.

10. The safety glass laminate of claim 1, wherein the rigid sheet is a glass sheet and the pre-laminate assembly comprises layers laid up in an order selected from the group consisting of:
glass/ION;
glass/ION/film;
glass/ION/glass;
glass/ION/film/ION/glass; and
glass/ION/film/ION/film;
wherein the film comprises a material selected from the group consisting of acid copolymers and ionomers derived therefrom, poly(ethylene vinyl acetate)s, poly(vinyl acetal)s, polyurethanes, polyvinylchlorides, polyethylenes, polyolefin block elastomers, ethylene acrylate ester copolymers, silicone elastomers, epoxy resins, metal foils, polyesters, poly(ethylene naphthalate)s, polycarbonates, polyolefins, norbornene polymers, polystyrenes, styrene-acrylate copolymers, acrylonitrile-styrene copolymers, polysulfones, nylons, acrylics, cellulose acetates, cellophanes, and fluoropolymers; and
wherein "ION" represents the polymeric film or sheet.

11. A solar cell module prepared by a process comprising the steps of:
providing a polymeric film or sheet; wherein the polymeric film or sheet consists essentially of an ionomeric composition;
wherein said polymeric film or sheet is formed from a melt of the ionomeric composition, and said melt is processed a temperature sufficiently low to prevent premature cross-linking in the ionomeric composition; and
wherein said ionomeric composition consists essentially of:
an ionomeric copolymer consisting essentially of copolymerized repeat units of ethylene; about 10 to about 30 wt %, based on the total weight of the ionomeric copolymer, of copolymerized repeat units of at least one alpha,beta-ethylenically unsaturated carboxylic acid selected from the group consisting of acrylic acid, methacrylic acid, itaconic acid, maleic acid, maleic anhydride, fumaric acid, and monomethyl maleic acid; and 0 to about 50 wt %, based on the total weight of the ionomeric copolymer, of copolymerized repeat units of one or more other unsaturated comonomers selected from the group consisting of methyl acrylate, methyl methacrylate, ethyl acrylate, ethyl methacrylate, isopropyl acrylate, isopropyl methacrylate, butyl acrylate and butyl methacrylate; wherein the ionomeric copolymer is neutralized to a level of 1 to 100 mol % based on the total number of moles of carboxylate groups in the ionomeric copolymer, and said ionomeric copolymer further comprises one or more metal ions; and further wherein the ionomeric copolymer has a Melt Index of about 20 to about 300 g/10 min, as measured by ASTM D1238 at 190° C. and under a load of 2160 g;

about 0.5 to about 3 wt % of at least one organic peroxide, based on the total weight of the ionomeric composition;

optionally about 0.01 to about 5 wt % of one or more silane coupling agents, based on the total weight of the ionomeric composition; and optionally one or more additives selected from the group consisting of initiators, inhibitors, plasticizers, processing aides, flow enhancing additives, lubricants, pigments, dyes, flame retardants, impact modifiers, nucleating agents, antiblocking agents, thermal stabilizers, UV absorbers, UV stabilizers, hindered amine light stabilizers, dispersants, surfactants, chelating agents, coupling agents, adhesives, primers, reinforcement additives and fillers;

laying up the polymeric film or sheet with a solar cell component comprising one or a plurality of solar cells and optionally with at least one additional layer to form a pre-laminate assembly;

subjecting the pre-laminate assembly to heat and optionally vacuum or pressure to form the solar cell module; and heating the solar cell module at a temperature sufficient to cause the peroxide to cross-link and cure the ionomeric composition.

12. The solar cell module of claim 11 wherein the one or more additives are selected from the group consisting of:

about 0.01 to about 0.05 wt % of the initiator dibutyltin dilaurate;

up to about 5 wt % of one or more inhibitors, said inhibitor(s) selected from the group consisting of hydroquinone, hydroquinone monomethyl ether, p-benzoquinone, and methylhydroquinone;

about 0.05 wt % up to about 5 wt % of the thermal stabilizer;

about 0.05 wt % to about 5 wt % of the UV absorber; and about 0.05 wt % to about 5 wt % of the hindered amine light stabilizer;

wherein the weight percentages are based on the total weight of the ionomeric composition.

13. The solar cell module of claim 11, wherein the ionomeric copolymer has a Melt Index of about 75 to about 100 g/10 min.

14. The solar cell module of claim 11, wherein the ionomeric composition consists essentially of the ionomeric copolymer and about 1.5 to about 3 wt % of the at least one organic peroxide; wherein the ionomeric copolymer consists essentially of the copolymerized repeat units of ethylene and about 15 to about 23 wt % of copolymerized repeat units of acrylic acid, methacrylic acid, or acrylic acid and methacrylic acid; and wherein the ionomeric copolymer has a Melt Index of about 30 to about 200 g/10 min.

15. The solar cell module of claim 11, wherein the at least one alpha,beta-ethylenically unsaturated carboxylic acid is selected from the group consisting of acrylic acid and methacrylic acid; the ionomeric copolymer comprises about 15 to about 23 wt % of the copolymerized repeat units of the at least one alpha,beta-ethylenically unsaturated carboxylic acid; and the ionomeric copolymer is neutralized to a level of 2 to 40 mol %.

16. The solar cell module of claim 11, wherein the ionomeric composition comprises the one or more silane coupling agents, said silane coupling agent(s) selected from the group consisting of gamma-chloropropylmethoxy-silane, vinyltrimethoxysilane, vinyltriethoxysilane, vinyltris(beta-methoxyethoxy)silane,gamma-vinylbenzylpropyltrimethoxysilane, N-beta-(N-vinylbenzylaminoethyl)-gamma-aminopropyltrimethoxysilane, gamma-methacryloxypropyltrimethoxysilane, vinyltriacetoxysilane, gamma-glycidoxypropyltrimethoxysilane, gamma-glycidoxypropyltriethoxysilane, beta-(3,4-epoxycyclohexyl)ethyltrimethoxysilane, vinyltrichlorosilane, gamma-mercaptopropylmethoxysilane, gamma-aminopropyltriethoxysilane, and N-beta-(aminoethyl)-gamma-aminopropyltrimethoxysilane.

17. The solar cell module of claim 11, wherein the at least one organic peroxide is selected from the group consisting of 2,5-dimethylhexane-2,5-dihydroperoxide, 2,5-dimethyl-2,5-di(tert-betylperoxy)hexane-3, di-tert-butyl peroxide, tert-butylcumyl peroxide, 2,5-dimethyl-2,5-di(tert-butylperoxy)hexane, dicumyl peroxide, alpha, alpha'-bis(tert-butylperoxyisopropyl)benzene, n-butyl-4,4-bis(tert-butylperoxy)valerate, 2,2-bis(tert-butylperoxy)butane, 1,1-bis(tert-butylperoxy)cyclohexane, 1,1-bis(tert-butylperoxy)-3,3,5-trimethyl-cyclohexane, tert-butyl peroxybenzoate, and benzoyl peroxide.

18. The solar cell module of claim 11, wherein the pre-laminate assembly comprises layers laid up in an order selected from the group consisting of:

glass/ION/solar cell/ION/glass;
glass/ION/solar cell/ION/fluoropolymer film;
fluoropolymer film/ION/solar cell/ION/glass;
fluoropolymer film/ION/solar cell/ION/fluoropolymer film;
glass/ION/solar cell/ION/polyester film;
fluoropolymer film/ION/solar cell/ION/polyester film;
glass/ION/solar cell/ION/barrier coated film/ION/glass;
fluoropolymer film/ION/barrier coated film/ION/solar cell/ION/barrier coated film/ION/fluoropolymer film;
glass/ION/solar cell/ION/aluminum stock;
fluoropolymer film/ION/solar cell/ION/aluminum stock;
glass/ION/solar cell/ION/galvanized steel sheet;
glass/ION/solar cell/ION/polyester film/ION/aluminum stock;
fluoropolymer film/ION/solar cell/ION/polyester film/ION/aluminum stock;
glass/ION/solar cell/ION/polyester film/ION/galvanized steel sheet;
fluoropolymer film/ION/solar cell/ION/polyester film/ION/galvanized steel sheet;
glass/ION/solar cell/acoustic poly(vinyl butyral) encapsulant layer/glass;
glass/ION/solar cell/poly(vinyl butyral) encapsulant layer/fluoropolymer film;
fluoropolymer film/ION/solar cell/acid copolymer encapsulant layer/Tedlar® film;

glass/ION/solar cell/ethylene vinyl acetate encapsulant layer/polyester film;
fluoropolymer film/ION/solar cell/poly(ethylene-co-methyl acrylate) encapsulant layer/polyester film; and
glass/poly(ethylene-co-butyl acrylate) encapsulant layer/solar cell/ION/barrier coated film/poly(ethylene-co-butyl acrylate) encapsulant layer/glass;
wherein "ION" represents the polymeric film or sheet.

* * * * *